United States Patent
Chow et al.

(10) Patent No.: US 12,049,582 B2
(45) Date of Patent: Jul. 30, 2024

(54) METHODS TO IMPROVE THE QUANTUM YIELD OF INDIUM PHOSPHIDE QUANTUM DOTS

(71) Applicant: Shoei Chemical Inc., Tokyo (JP)

(72) Inventors: Yeewah Annie Chow, San Jose, CA (US); Jason Hartlove, Los Altos, CA (US); Charles Hotz, San Rafael, CA (US); Chunming Wang, Milpitas, CA (US); Wenzhou Guo, San Jose, CA (US); Ilan Jen-La Plante, San Jose, CA (US); Jason Travis Tillman, Newark, CA (US); John J. Curley, San Francisco, CA (US); Christian Ippen, Cupertino, CA (US); Alexander Tu, San Jose, CA (US); Ke Gong, Irvine, CA (US); Minghu Tu, Milpitas, CA (US)

(73) Assignee: SHOEI CHEMICAL INC., Tokyo (JP)

( * ) Notice: Subject to any disclaimer, the term of this patent is extended or adjusted under 35 U.S.C. 154(b) by 492 days.

(21) Appl. No.: 16/847,782

(22) Filed: Apr. 14, 2020

(65) Prior Publication Data

US 2020/0325396 A1    Oct. 15, 2020

Related U.S. Application Data

(60) Provisional application No. 62/834,021, filed on Apr. 15, 2019.

(51) Int. Cl.

| | |
|---|---|
| *H10K 50/115* | (2023.01) |
| *C09K 11/02* | (2006.01) |
| *C09K 11/08* | (2006.01) |
| *C09K 11/88* | (2006.01) |
| *G02F 1/13357* | (2006.01) |
| *B82Y 20/00* | (2011.01) |
| *B82Y 40/00* | (2011.01) |
| *F21V 8/00* | (2006.01) |
| *G02F 1/1335* | (2006.01) |

(52) U.S. Cl.
CPC ........... *C09K 11/883* (2013.01); *C09K 11/02* (2013.01); *C09K 11/0883* (2013.01); *G02F 1/1336* (2013.01); *H10K 50/115* (2023.02); *B82Y 20/00* (2013.01); *B82Y 40/00* (2013.01); *G02B 6/005* (2013.01); *G02F 1/133614* (2021.01); *G02F 2202/36* (2013.01)

(58) Field of Classification Search
CPC ... C09K 11/883; C09K 11/02; C09K 11/0883; C09K 11/025; C09K 11/565; C09K 11/70; G02F 1/1336; G02F 1/133614; G02F 2202/36; H01L 51/502; B82Y 20/00; B82Y 40/00; G02B 6/005
See application file for complete search history.

(56) References Cited

U.S. PATENT DOCUMENTS

| | | | |
|---|---|---|---|
| 2012/0205586 A1* | 8/2012 | Ren | C30B 7/00 252/301.36 |
| 2017/0306227 A1 | 10/2017 | Ippen et al. | |
| 2017/0335187 A1* | 11/2017 | Guo | C09K 11/565 |
| 2018/0105739 A1 | 4/2018 | Kim et al. | |
| 2018/0375046 A1* | 12/2018 | Lee | C09K 11/02 |
| 2019/0280231 A1* | 9/2019 | Kim | H10K 50/115 |
| 2020/0002604 A1* | 1/2020 | Youn | G02B 6/005 |
| 2020/0087572 A1* | 3/2020 | Davidi | C09K 11/025 |

FOREIGN PATENT DOCUMENTS

| | | | | |
|---|---|---|---|---|
| EP | 3275967 A1 | | 1/2018 | |
| EP | 3490020 A1 * | | 5/2019 | ............. H01L 33/06 |
| EP | 3660124 A1 | | 6/2020 | |
| WO | WO-2018108767 A1 * | | 6/2018 | ............. C09K 11/02 |
| WO | WO-2019173259 A1 | | 9/2019 | |

OTHER PUBLICATIONS

Blackburn, J.L., et al., "Electron and Hole Transfer from Indium Phosphide Quantum Dots," *J Phys Chem B* 109(7):2625-2631, American Chemical Society, United States (2005).

Chibli, H., et al., "Cytotoxicity of InP/ZnS quantum dots related to reactive oxygen species generation," *Nanoscale* 3(6):2552-2559, Royal Society of Chemistry, United Kingdom (2011).

International Search Report and Written Opinion for International Application No. PCT/US2020/028135, European Patent Office, Netherlands, mailed on Jul. 21, 2020, 9 pages.

Selmarten, D., et al., "Quenching of Semiconductor Quantum Dot Photoluminescence by a π-Conjugated Polymer," *J Phys Chem B* 109(33):15927-15932, American Chemical Society, United States (2005).

Wang, A., et al., "Bright, efficient, and color-stable violet ZnSe-based quantum dot light-emitting diodes," *Nanoscale* 7:2951-2959, Royal Society of Chemistry, United Kingdom (2015 ).

* cited by examiner

*Primary Examiner* — Donald L Raleigh
(74) *Attorney, Agent, or Firm* — Alleman Hall & Tuttle LLP (57) ABSTRACT

This disclosure pertains to the field of nanotechnology. The disclosure provides methods of preparing nanostructures using in situ prepared zinc dioleate and/or a metal halide. The nanostructures have high quantum yield, narrow emission peak width, tunable emission wavelength, and colloidal stability. Also provided are nanostructures prepared using the methods. And, nanostructure films and molded articles comprising the nanostructures are also provided.

13 Claims, 1 Drawing Sheet

METHODS TO IMPROVE THE QUANTUM YIELD OF INDIUM PHOSPHIDE QUANTUM DOTS

FIELD OF THE INVENTION

Field of the Invention

This disclosure pertains to the field of nanotechnology. The disclosure provides methods of preparing nanostructures using in situ prepared zinc dioleate and/or a metal halide. The nanostructures have high quantum yield, narrow emission peak width, tunable emission wavelength, and colloidal stability. Also provided are nanostructures prepared using the methods. And, nanostructure films and molded articles comprising the nanostructures are also provided.

Background Art

Semiconductor nanostructures can be incorporated into a variety of electronic and optical devices. The electrical and optical properties of such nanostructures vary, e.g., depending on their composition, shape, and size. For example, size-tunable properties of semiconductor nanoparticles are of great interest for applications such as light emitting diodes (LEDs) and liquid crystal displays (LCDs). Highly luminescent nanostructures are particularly desirable for such applications.

To exploit the full potential of nanostructures in applications such as LEDs and LCDs, the nanostructures need to simultaneously meet five criteria: narrow and symmetric emission spectra, high photoluminescence quantum yields (PLQYs), high optical stability, eco-friendly materials, and low-cost methods for mass production. Most previous studies on highly emissive and color-tunable quantum dots have concentrated on materials containing cadmium, mercury, or lead. Wang, A., et al., *Nanoscale* 7:2951-2959 (2015). But, there are increasing concerns that toxic materials such as cadmium, mercury, or lead would pose serious threats to human health and the environment and the European Union's Restriction of Hazardous Substances rules ban any consumer electronics containing more than trace amounts of these materials. Therefore, there is a need to produce materials that are free of cadmium, mercury, and lead for the production of LEDs and LCDs.

Cadmium-free quantum dots based on indium phosphide are inherently less stable than the prototypic cadmium selenide quantum dots. The higher valence and conduction band energy levels make indium phosphide quantum dots more susceptible to photo-oxidation by electron transfer from an excited quantum dot to oxygen, as well as more susceptible to photoluminescence quenching by electron-donating agents such as amines or thiols where hole trapping from the quantum dot excited state can suppress radiative recombination of excitons. See, e.g., Chibli, H., et al., "Cytotoxicity of InP/ZnS quantum dots related to reactive oxygen species generation," *Nanoscale* 3:2552-2559 (2011); Blackburn, J. L., et al., "Electron and Hole Transfer from Indium Phosphide Quantum Dots," *J. Phys. Chem. B* 109: 2625-2631 (2005); and Selmarten, D., et al., "Quenching of Semiconductor Quantum Dot Photoluminescence by a π-Conjugated Polymer," *J. Phys. Chem. B* 109:15927-15933 (2005).

Achieving high photoluminescence quantum yield (PLQY) in emissive quantum dots is critical to their performance in emissive display applications including quantum dot enhancement films, quantum dots on glass, and quantum dot photoresists. Existing approaches to increasing quantum yield rely on altering the quantum dot composition, either by changes to the core size or material, or to the shell layer compositions and thicknesses. These alterations directly impact other properties of the quantum dots including emission wavelength (PWL) and size.

A need exists to produce nanostructures that have high quantum yield, narrow emission peak width, tunable emission wavelength, and colloidal stability.

BRIEF SUMMARY OF THE INVENTION

The present disclosure provides a nanostructure comprising a core comprising indium phosphide and at least two shells, wherein at least one of the shells comprises zinc, wherein the nanostructure displays a photoluminescence quantum yield between about 90% and about 100%, and a wherein the nanostructure has a full width at half-maximum of less than 45 nm.

In some embodiments, the nanostructure comprises two shells.

In some embodiments, at least one shell in the nanostructure is selected from the group consisting of ZnS, ZnO, ZnSe, ZnTe, and alloys thereof.

In some embodiments, at least one shell in the nanostructure comprises ZnSe.

In some embodiments, at least one shell in the nanostructure comprises ZnS.

In some embodiments, at least two shells in the nanostructure comprise zinc.

In some embodiments, at least one shell in the nanostructure comprises ZnSe and at least one shell comprises ZnS.

In some embodiments, the nanostructure exhibits a photoluminescence quantum yield of between about 94% and about 100%.

In some embodiments, the nanostructure exhibits a photoluminescence quantum yield of between about 96% and about 100%.

In some embodiments, the nanostructure exhibits a full width at half-maximum of between about 10 nm and about 40 nm.

In some embodiments, the nanostructure composition exhibits a full width at half-maximum of between about 10 nm and about 35 nm.

In some embodiments, the nanostructure comprises at least one shell comprising ZnSe, and at least one shell comprising ZnS.

In some embodiments, the nanostructures are quantum dots.

The present disclosure also provides a nanostructure composition comprising:
(a) a nanostructure of the present disclosure; and
(b) at least one organic resin.

The present disclosure also provides a method of preparing a nanostructure comprising a core and at least two shells comprising:
(a) admixing a zinc source and a core comprising InP;
(b) admixing (a) with an organic acid;
(c) admixing (b) with at least one shell precursor;
(d) raising, lowering, or maintaining the temperature to between about 200° C. and about 310° C.;
(e) admixing (d) with at least one shell precursor, wherein the shell precursor is different from the shell precursor in (c); and
(f) raising, lowering, or maintaining the temperature to between about 200° C. and about 310° C.;

to produce a nanostructure comprising a core and at least two shells, wherein at least one of the shells comprises zinc, and wherein the nanostructure displays a photoluminescence quantum yield between about 90% and about 100%.

In some embodiments, the admixing in (a) further comprises at least one metal halide.

In some embodiments, the admixing in (c) further comprises at least one metal halide.

In some embodiments, the method further comprises (g) admixing (f) with at least one metal halide.

In some embodiments, the nanostructure comprises two shells.

In some embodiments, at least one shell in the nanostructure is selected from the group consisting of ZnS, ZnO, ZnSe, ZnTe, and alloys thereof.

In some embodiments, at least one shell in the nanostructure comprises ZnSe.

In some embodiments, at least one shell in the nanostructure comprises ZnS.

In some embodiments, at least two shells in the nanostructure comprise zinc.

In some embodiments, at least one shell in the nanostructure comprises ZnSe and at least one shell comprises ZnS.

In some embodiments, the zinc source is selected from the group consisting of diethylzinc, dimethylzinc, zinc acetate, zinc acetylacetonate, zinc iodide, zinc bromide, zinc chloride, zinc fluoride, zinc carbonate, zinc cyanide, zinc nitrate, zinc oleate, zinc oxide, zinc peroxide, zinc perchlorate, zinc sulfate, zinc hexanoate, zinc octanoate, zinc laurate, zinc myristate, zinc palmitate, zinc stearate, zinc dithiocarbamate, or mixtures thereof.

In some embodiments, the zinc source is zinc dioleate.

In some embodiments, the zinc source is in situ prepared zinc dioleate.

In some embodiments, the organic acid is lauric acid, hexanoic acid, oleic acid, trifluoromethanesulfonic acid, octyl phosphonic acid, 2-ethylhexanoic acid, myristic acid, decanoic acid, palmitic acid, stearic acid, linoleic acid, or mixtures thereof.

In some embodiments, the organic acid is oleic acid.

In some embodiments, at least one metal halide admixed in (a) is selected from the group consisting of LiF, NaF, KF, $BeF_2$, $MgF_2$, $CaF_2$, $SrF_2$, CuF, AgF, AuF, $ZnF_2$, $HgF_2$, $AlF_3$, $GaF_3$, $InF_3$, $SnF_2$, $PbF_2$, LiCl, NaCl, KCl, $BeCl_2$, $MgCl_2$, $CaCl_2$, $SrCl_2$, CuCl, AgCl, $ZnCl_2$, $HgCl_2$, $AlCl_3$, $GaCl_3$, $InCl_3$, $SnCl_2$, $PBCl_2$, LiBr, NaBr, KBr, $BeBr_2$, $MgBr_2$, $CaBr_2$, $SrBr_2$, CuBr, AgBr, AuBr, $ZnBr_2$, $HgBr_2$, $AlBr_3$, $GaBr_3$, $InBr_3$, $SnBr_2$, $PbBr_2$, LiI, NaI, KI, $BeI_2$, $MgI_2$, $CaI_2$, $SrI_2$, CuI, AgI, AuI, $ZnI_2$, $HgI_2$, $AlI_3$, $GaI_3$, $InI_3$, $SnI_2$, $PbI_2$, and combinations thereof.

In some embodiments, the at least one metal halide admixed in (a) is $ZnCl_2$.

In some embodiments, the at least one metal halide admixed in (c) is selected from the group consisting of LiF, NaF, KF, $BeF_2$, $MgF_2$, $CaF_2$, $SrF_2$, CuF, AgF, AuF, $ZnF_2$, $HgF_2$, $AlF_3$, $GaF_3$, $InF_3$, $SnF_2$, $PbF_2$, LiCl, NaCl, KCl, $BeCl_2$, $MgCl_2$, $CaCl_2$, $SrCl_2$, CuCl, AgCl, $ZnCl_2$, $HgCl_2$, $AlCl_3$, $GaCl_3$, $InCl_3$, $SnCl_2$, $PBCl_2$, LiBr, NaBr, KBr, $BeBr_2$, $MgBr_2$, $CaBr_2$, $SrBr_2$, CuBr, AgBr, AuBr, $ZnBr_2$, $HgBr_2$, $AlBr_3$, $GaBr_3$, $InBr_3$, $SnBr_2$, $PbBr_2$, LiI, NaI, KI, $BeI_2$, $MgI_2$, $CaI_2$, $SrI_2$, CuI, AgI, AuI, $ZnI_2$, $HgI_2$, $AlI_3$, $GaI_3$, $InI_3$, $SnI_2$, $PbI_2$, and combinations thereof.

In some embodiments, the at least one metal halide admixed in (c) is $GaCl_3$, $AlCl_3$, $YCl_3$, $MgBr_2$, $ZnBr_2$, $ZrCl_4$, and combinations thereof.

In some embodiments, the at least one metal halide admixed in (f) is selected from the group consisting of LiF, NaF, KF, $BeF_2$, $MgF_2$, $CaF_2$, $SrF_2$, CuF, AgF, AuF, $ZnF_2$, $HgF_2$, $AlF_3$, $GaF_3$, $InF_3$, $SnF_2$, $PbF_2$, LiCl, NaCl, KCl, $BeCl_2$, $MgCl_2$, $CaCl_2$, $SrCl_2$, CuCl, AgCl, $ZnCl_2$, $HgCl_2$, $AlCl_3$, $GaCl_3$, $InCl_3$, $SnCl_2$, $PBCl_2$, LiBr, NaBr, KBr, $BeBr_2$, $MgBr_2$, $CaBr_2$, $SrBr_2$, CuBr, AgBr, AuBr, $ZnBr_2$, $HgBr_2$, $AlBr_3$, $GaBr_3$, $InBr_3$, $SnBr_2$, $PbBr_2$, LiI, NaI, KI, $BeI_2$, $MgI_2$, $CaI_2$, $SrI_2$, CuI, AgI, AuI, $ZnI_2$, $HgI_2$, $AlI_3$, $GaI_3$, $InI_3$, $SnI_2$, $PbI_2$, and combinations thereof.

In some embodiments, the at least one metal halide admixed in (f) is $ZnCl_2$.

In some embodiments, the at least one shell precursor in (c) is a selenium source or a sulfur source.

In some embodiments, the at least one shell precursor in (c) is a sulfur source.

In some embodiments, the sulfur source is selected from the group consisting of elemental sulfur, octanethiol, dodecanethiol, octadecanethiol, tributylphosphine sulfide, cyclohexyl isothiocyanate, α-toluenethiol, ethylene trithiocarbonate, allyl mercaptan, bis(trimethylsilyl) sulfide, trioctylphosphine sulfide, and combinations thereof.

In some embodiments, the sulfur source is dodecanethiol.

In some embodiments, the at least one shell precursor in (c) is a selenium source.

In some embodiments, the selenium source is selected from the group consisting of trioctylphosphine selenide, tri(n-butyl)phosphine selenide, tri(sec-butyl)phosphine selenide, tri(tert-butyl)phosphine selenide, trimethylphosphine selenide, triphenylphosphine selenide, diphenylphosphine selenide, phenylphosphine selenide, tricyclohexylphosphine selenide, cyclohexylphosphine selenide, 1-octaneselenol, 1-dodecaneselenol, selenophenol, elemental selenium, hydrogen selenide, bis(trimethylsilyl) selenide, selenourea, and combinations thereof.

In some embodiments, the temperature in (d) is raised, lowered, or maintained to between about 200° C. and about 310° C.

In some embodiments, the temperature in (d) is raised, lowered, or maintained to between about 280° C. and about 310° C.

In some embodiments, the admixing in (e) is at a temperature between about 10° C. and about 100° C.

In some embodiments, the at least one shell precursor in (e) is a selenium source or a sulfur source.

In some embodiments, the at least one shell precursor in (e) is a sulfur source.

In some embodiments, the sulfur source is selected from the group consisting of elemental sulfur, octanethiol, dodecanethiol, octadecanethiol, tributylphosphine sulfide, cyclohexyl isothiocyanate, α-toluenethiol, ethylene trithiocarbonate, allyl mercaptan, bis(trimethylsilyl) sulfide, trioctylphosphine sulfide, and combinations thereof.

In some embodiments, the sulfur source is dodecanethiol.

In some embodiments, the at least one shell precursor in (e) is a selenium source.

In some embodiments, the selenium source is selected from the group consisting of trioctylphosphine selenide, tri(n-butyl)phosphine selenide, tri(sec-butyl)phosphine selenide, tri(tert-butyl)phosphine selenide, trimethylphosphine selenide, triphenylphosphine selenide, diphenylphosphine selenide, phenylphosphine selenide, tricyclohexylphosphine selenide, cyclohexylphosphine selenide, 1-octaneselenol, 1-dodecaneselenol, selenophenol, elemental selenium, hydrogen selenide, bis(trimethylsilyl) selenide, selenourea, and combinations thereof.

In some embodiments, the temperature in (f) is raised, lowered, or maintained to between about 200° C. and about 310° C.

In some embodiments, the temperature in (f) is raised, lowered, or maintained to between about 280° C. and about 310° C.

In some embodiments, the nanostructure displays a photoluminescence quantum yield of between about 94% and about 100%.

In some embodiments, the nanostructure displays a photoluminescence quantum yield of between about 96% and about 100%.

In some embodiments, the nanostructure has a full width at half-maximum of between about 10 nm and about 40 nm.

In some embodiments, the nanostructure has a full width at half-maximum of between about 10 nm and about 35 nm.

The present disclosure also provides a nanostructure molded article comprising:

(a) a first conductive layer;
(b) a second conductive layer; and
(c) a nanostructure layer between the first conductive layer and the second conductive layer, wherein the nanostructure layer comprises a population of nanostructures comprising a core comprising indium phosphide and at least two shells, wherein at least one of the shells comprises zinc, wherein the nanostructure displays a photoluminescence quantum yield between about 90% and about 100%, and wherein the nanostructure has a full width at half-maximum of less than 45 nm; and at least one organic resin.

In some embodiments, the nanostructures in the molded article comprise two shells.

In some embodiments, the nanostructures in the molded article comprise at least one shell is selected from the group consisting of ZnS, ZnO, ZnSe, ZnTe, and alloys thereof.

In some embodiments, the nanostructures in the molded article comprise at least one shell comprising ZnSe.

In some embodiments, the nanostructures in the molded article comprise at least one shell comprising ZnS.

In some embodiments, the nanostructures in the molded article comprise at least two shells comprising zinc.

In some embodiments, the nanostructures in the molded article comprise at least one shell comprising ZnSe and at least one shell comprises ZnS.

In some embodiments, the nanostructures in the molded article exhibit a photoluminescence quantum yield of between about 94% and about 100%.

In some embodiments, the nanostructures in the molded article comprises exhibit a photoluminescence quantum yield of between about 96% and about 100%.

In some embodiments, the nanostructures in the molded article comprises exhibit a full width at half-maximum of between about 10 nm and about 40 nm.

In some embodiments, the nanostructures in the molded article comprises exhibit a full width at half maximum of between about 10 nm and about 35 nm.

In some embodiments, the nanostructures in the molded article comprise at least one shell comprising ZnSe, and at least one shell comprising ZnS.

In some embodiments, the nanostructures in the molded article are quantum dots.

DETAILED DESCRIPTION OF THE INVENTION

Definitions

Figure 1:
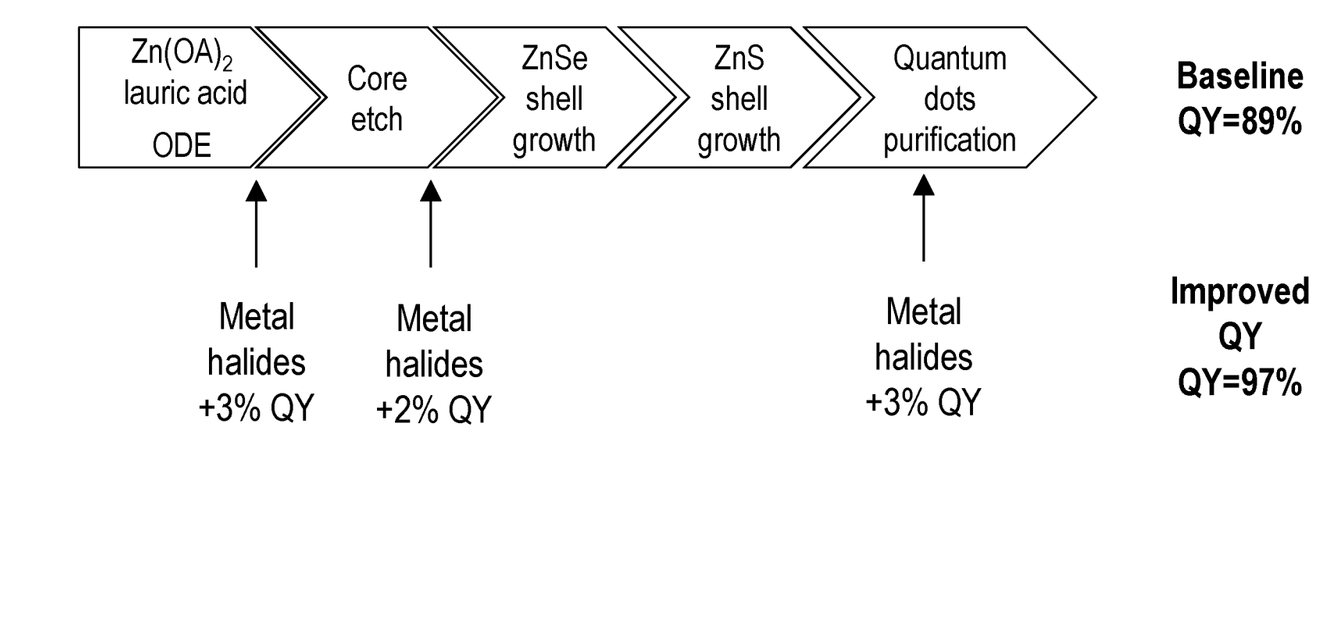
FIG. 1 is a schematic of the shelling process for green InP/ZnSe/ZnS core/shell/shell nanostructures indicating the application of metal halides at various steps in the shelling process.

Unless defined otherwise, all technical and scientific terms used herein have the same meaning as commonly understood by one of ordinary skill in the art to which the invention pertains. The following definitions supplement those in the art and are directed to the current application and are not to be imputed to any related or unrelated case, e.g., to any commonly owned patent or application. Although any methods and materials similar or equivalent to those described herein can be used in the practice for testing of the present invention, the preferred materials and methods are described herein. Accordingly, the terminology used herein is for the purpose of describing particular embodiments only, and is not intended to be limiting.

As used in this specification and the appended claims, the singular forms "a," "an" and "the" include plural referents unless the context clearly dictates otherwise. Thus, for example, reference to "a nanostructure" includes a plurality of such nanostructures, and the like.

The term "about" as used herein indicates the value of a given quantity varies by ±10% of the value. For example, "about 100 nm" encompasses a range of sizes from 90 nm to 110 nm, inclusive.

A "nanostructure" is a structure having at least one region or characteristic dimension with a dimension of less than about 500 nm. In some embodiments, the nanostructure has a dimension of less than about 200 nm, less than about 100 nm, less than about 50 nm, less than about 20 nm, or less than about 10 nm. Typically, the region or characteristic dimension will be along the smallest axis of the structure. Examples of such structures include nanowires, nanorods, nanotubes, branched nanostructures, nanotetrapods, nanotripods, nanobipods, nanocrystals, nanodots, quantum dots, nanoparticles, and the like. Nanostructures can be, e.g., substantially crystalline, substantially monocrystalline, polycrystalline, amorphous, or a combination thereof. In some embodiments, each of the three dimensions of the nanostructure has a dimension of less than about 500 nm, less than about 200 nm, less than about 100 nm, less than about 50 nm, less than about 20 nm, or less than about 10 nm.

The term "heterostructure" when used with reference to nanostructures refers to nanostructures characterized by at least two different and/or distinguishable material types. Typically, one region of the nanostructure comprises a first material type, while a second region of the nanostructure comprises a second material type. In certain embodiments, the nanostructure comprises a core of a first material and at least one shell of a second (or third etc.) material, where the different material types are distributed radially about the long axis of a nanowire, a long axis of an arm of a branched nanowire, or the center of a nanocrystal, for example. A shell can, but need not, completely cover the adjacent materials to be considered a shell or for the nanostructure to be considered a heterostructure; for example, a nanocrystal characterized by a core of one material covered with small islands of a second material is a heterostructure. In other embodiments, the different material types are distributed at different locations within the nanostructure; e.g., along the major (long) axis of a nanowire or along a long axis of arm of a branched nanowire. Different regions within a heterostructure can comprise entirely different materials, or the different regions can comprise a base material (e.g., silicon) having different dopants or different concentrations of the same dopant.

As used herein, the "diameter" of a nanostructure refers to the diameter of a cross-section normal to a first axis of the nanostructure, where the first axis has the greatest difference in length with respect to the second and third axes (the second and third axes are the two axes whose lengths most nearly equal each other). The first axis is not necessarily the longest axis of the nanostructure; e.g., for a disk-shaped nanostructure, the cross-section would be a substantially circular cross-section normal to the short longitudinal axis of the disk. Where the cross-section is not circular, the diameter is the average of the major and minor axes of that cross-section. For an elongated or high aspect ratio nanostructure, such as a nanowire, the diameter is measured across a cross-section perpendicular to the longest axis of the nanowire. For a spherical nanostructure, the diameter is measured from one side to the other through the center of the sphere.

The terms "crystalline" or "substantially crystalline," when used with respect to nanostructures, refer to the fact that the nanostructures typically exhibit long-range ordering across one or more dimensions of the structure. It will be understood by one of skill in the art that the term "long range ordering" will depend on the absolute size of the specific nanostructures, as ordering for a single crystal cannot extend beyond the boundaries of the crystal. In this case, "long-range ordering" will mean substantial order across at least the majority of the dimension of the nanostructure. In some instances, a nanostructure can bear an oxide or other coating, or can be comprised of a core and at least one shell. In such instances it will be appreciated that the oxide, shell(s), or other coating can but need not exhibit such ordering (e.g. it can be amorphous, polycrystalline, or otherwise). In such instances, the phrase "crystalline," "substantially crystalline," "substantially monocrystalline," or "monocrystalline" refers to the central core of the nanostructure (excluding the coating layers or shells). The terms "crystalline" or "substantially crystalline" as used herein are intended to also encompass structures comprising various defects, stacking faults, atomic substitutions, and the like, as long as the structure exhibits substantial long range ordering (e.g., order over at least about 80% of the length of at least one axis of the nanostructure or its core). In addition, it will be appreciated that the interface between a core and the outside of a nanostructure or between a core and an adjacent shell or between a shell and a second adjacent shell can contain non-crystalline regions and can even be amorphous. This does not prevent the nanostructure from being crystalline or substantially crystalline as defined herein.

The term "monocrystalline" when used with respect to a nanostructure indicates that the nanostructure is substantially crystalline and comprises substantially a single crystal. When used with respect to a nanostructure heterostructure comprising a core and one or more shells, "monocrystalline" indicates that the core is substantially crystalline and comprises substantially a single crystal.

A "nanocrystal" is a nanostructure that is substantially monocrystalline. A nanocrystal thus has at least one region or characteristic dimension with a dimension of less than about 500 nm. In some embodiments, the nanocrystal has a dimension of less than about 200 nm, less than about 100 nm, less than about 50 nm, less than about 20 nm, or less than about 10 nm. The term "nanocrystal" is intended to encompass substantially monocrystalline nanostructures comprising various defects, stacking faults, atomic substitutions, and the like, as well as substantially monocrystalline nanostructures without such defects, faults, or substitutions. In the case of nanocrystal heterostructures comprising a core and one or more shells, the core of the nanocrystal is typically substantially monocrystalline, but the shell(s) need not be. In some embodiments, each of the three dimensions of the nanocrystal has a dimension of less than about 500 nm, less than about 200 nm, less than about 100 nm, less than about 50 nm, less than about 20 nm, or less than about 10 nm.

The term "quantum dot" (or "dot") refers to a nanocrystal that exhibits quantum confinement or exciton confinement. Quantum dots can be substantially homogenous in material properties, or in certain embodiments, can be heterogeneous, e.g., including a core and at least one shell. The optical properties of quantum dots can be influenced by their particle size, chemical composition, and/or surface composition, and can be determined by suitable optical testing available in the art. The ability to tailor the nanocrystal size, e.g., in the range between about 1 nm and about 15 nm, enables photoemission coverage in the entire optical spectrum to offer great versatility in color rendering.

A "ligand" is a molecule capable of interacting (whether weakly or strongly) with one or more faces of a nanostructure, e.g., through covalent, ionic, van der Waals, or other molecular interactions with the surface of the nanostructure.

"Photoluminescence quantum yield" is the ratio of photons emitted to photons absorbed, e.g., by a nanostructure or population of nanostructures. As known in the art, quantum yield is typically determined by a comparative method using well-characterized standard samples with known quantum yield values.

As used herein, the term "monolayer" is a measurement unit of shell thickness derived from the bulk crystal structure of the shell material as the closest distance between relevant lattice planes. By way of example, for cubic lattice structures the thickness of one monolayer is determined as the distance between adjacent lattice planes in the [111] direction. By way of example, one monolayer of cubic ZnSe corresponds to 0.33 nm and one monolayer of cubic ZnS corresponds to 0.31 nm thickness. The thickness of a monolayer of alloyed materials can be determined from the alloy composition through Vegard's law.

As used herein, the term "shell" refers to material deposited onto the core or onto previously deposited shells of the same or different composition and that result from a single act of deposition of the shell material. The exact shell thickness depends on the material as well as the precursor input and conversion and can be reported in nanometers or monolayers. As used herein, "target shell thickness" refers to the intended shell thickness used for calculation of the required precursor amount. As used herein, "actual shell thickness" refers to the actually deposited amount of shell material after the synthesis and can be measured by methods known in the art. By way of example, actual shell thickness can be measured by comparing particle diameters determined from TEM images of nanocrystals before and after a shell synthesis.

As used herein, the term "full width at half-maximum" (FWHM) is a measure of the size distribution of quantum dots. The emission spectra of quantum dots generally have the shape of a Gaussian curve. The width of the Gaussian curve is defined as the FWHM and gives an idea of the size distribution of the particles. A smaller FWHM corresponds to a narrower quantum dot nanocrystal size distribution. FWHM is also dependent upon the emission wavelength maximum.

"Peak emission wavelength" (PWL) is the wavelength where the radiometric emission spectrum of the light source reaches its maximum.

Unless clearly indicated otherwise, ranges listed herein are inclusive.

A variety of additional terms are defined or otherwise characterized herein.

Nanostructure

In some embodiments, the present disclosure provides a nanostructure comprising a core comprising indium phosphide and at least two shells, wherein at least one of the shells comprises zinc, wherein the nanostructure displays a photoluminescence quantum yield between about 90% and about 100%, and wherein the nanostructure has a full width at half-maximum of less than 45 nm.

In some embodiments, the present disclosure provides a nanostructure comprising a core comprising indium phosphide and at least two shells, wherein at least one of the shells comprises zinc, wherein the nanostructure displays a photoluminescence quantum yield between about 94% and about 100%, and wherein the nanostructure has a full width at half-maximum of less than 40 nm.

In some embodiments, the nanostructure is a quantum dot.

Nanostructure Composition

In some embodiments, the present disclosure provides a nanostructure composition comprising:
(a) at least one population of nanostructures, the nanostructures comprising a core comprising indium phosphide and at least two shells, wherein at least one of the shells comprises zinc, wherein the nanostructure displays a photoluminescence quantum yield between about 90% and about 100%, and wherein the nanostructure has a full width at half-maximum of less than 45 nm; and
(b) at least one organic resin.

In some embodiments, the present disclosure provides a nanostructure composition comprising:
(a) at least one population of nanostructures, the nanostructures comprising a core comprising indium phosphide and at least two shells, wherein at least one of the shells comprises zinc, wherein the nanostructure displays a photoluminescence quantum yield between about 94% and about 100%, and wherein the nanostructure has a full width at half-maximum of less than 40 nm; and
(b) at least one organic resin.

In some embodiments, the nanostructure is a quantum dot.

Nanostructure Molded Article

In some embodiments, the present disclosure provides a nanostructure molded article comprising:
(a) a first conductive layer;
(b) a second conductive layer; and
(c) a nanostructure layer between the first conductive layer and the second conductive layer, wherein the nanostructure layer comprises a population of nanostructures comprising a core comprising indium phosphide and at least two shells, wherein at least one of the shells comprises zinc, wherein the nanostructure displays a photoluminescence quantum yield between about 90% and about 100%, and wherein the nanostructure has a full width at half-maximum of less than 45 nm; and at least one organic resin.

In some embodiments, the present disclosure provides a nanostructure molded article comprising:
(a) a first conductive layer;
(b) a second conductive layer; and
(c) a nanostructure layer between the first conductive layer and the second conductive layer, wherein the nanostructure layer comprises a population of nanostructures comprising a core comprising indium phosphide and at least two shells, wherein at least one of the shells comprises zinc, wherein the nanostructure displays a photoluminescence quantum yield between about 94% and about 100%, and wherein the nanostructure has a full width at half-maximum of less than 40 nm; and at least one organic resin.

In some embodiments, the nanostructure is a quantum dot.

In some embodiments, the molded article is a film or substrate for a display. In some embodiments, the molded article is a liquid crystal display. In some embodiments, the molded article is a nanostructure film.

Indium Phosphide Core

In some embodiments, the nanostructure core comprises indium phosphide.

Synthesis of InP-based nanostructures has been described, e.g., in Xie, R., et al., "Colloidal InP nanocrystals as efficient emitters covering blue to near-infrared," *J. Am. Chem. Soc.* 129:15432-15433 (2007); Micic, O. I., et al., "Core-shell quantum dots of lattice-matched $ZnCdSe_2$ shells on InP cores: Experiment and theory," *J. Phys. Chem. B* 104:12149-12156 (2000); Liu, Z., et al., "Coreduction colloidal synthesis of III-V nanocrystals: The case of InP," *Angew. Chem. Int. Ed. Engl.* 47:3540-3542 (2008); Li, L. et al., "Economic synthesis of high quality InP nanocrystals using calcium phosphide as the phosphorus precursor," *Chem. Mater.* 20:2621-2623 (2008); D. Battaglia and X. Peng, "Formation of high quality InP and InAs nanocrystals in a noncoordinating solvent," *Nano Letters* 2:1027-1030 (2002); Kim, S., et al., "Highly luminescent InP/GaP/ZnS nanocrystals and their application to white light-emitting diodes," *J. Am. Chem. Soc.* 134:3804-3809 (2012); Nann, T., et al., "Water splitting by visible light: A nanophotocathode for hydrogen production," *Angew. Chem. Int. Ed.* 49:1574-1577 (2010); Borchert, H., et al., "Investigation of ZnS passivated InP nanocrystals by XPS," *Nano Letters* 2:151-154 (2002); L. Li and P. Reiss, "One-pot synthesis of highly luminescent InP/ZnS nanocrystals without precursor injection," *J. Am. Chem. Soc.* 130:11588-11589 (2008); Hussain, S., et al. "One-pot fabrication of high-quality InP/ZnS (core/shell) quantum dots and their application to cellular imaging," *Chemphyschem.* 10:1466-1470 (2009); Xu, S., et al., "Rapid synthesis of high-quality InP nanocrystals," *J. Am. Chem. Soc.* 128:1054-1055 (2006); Micic, O. I., et al., "Size-dependent spectroscopy of InP quantum dots," *J. Phys. Chem. B* 101:4904-4912 (1997); Haubold, S., et al., "Strongly luminescent InP/ZnS core-shell nanoparticles," *Chemphyschem.* 5:331-334 (2001); CrosGagneux, A., et al., "Surface chemistry of InP quantum dots: A comprehensive study," *J. Am. Chem. Soc.* 132:18147-18157 (2010); Micic, O. I., et al., "Synthesis and characterization of InP, GaP, and $GaInP_2$ quantum dots," *J. Phys. Chem.* 99:7754-7759 (1995); Guzelian, A. A., et al., "Synthesis of size-selected, surface-passivated InP nanocrystals," *J. Phys. Chem.* 100:7212-7219 (1996); Lucey, D. W., et al., "Monodispersed InP quantum dots prepared by colloidal chemistry in a non-coordinating solvent," *Chem. Mater.* 17:3754-3762 (2005); Lim, J., et al., "InP@ZnSeS, core@composition gradient shell quantum dots with enhanced stability," *Chem. Mater.* 23:4459-4463 (2011); and Zan, F., et al., "Experimental studies on blinking behavior of single InP/ZnS quantum dots: Effects of synthetic conditions and UV irradiation," *J. Phys. Chem. C* 116:394-3950 (2012). However, such efforts have had only limited success in producing InP nanostructures with high quantum yields.

The synthesis of InP cores having an emission wavelength of about 530 nm (green-emitting) and an emission wavelength of about 630 nm (red-emitting) have been described in U.S. Patent Appl. Nos. 2010/276638 and 2014/001405, which are incorporated herein by reference in their entireties.

In some embodiments, the core comprises InP having an emission wavelength between about 510 nm and about 550 nm. In some embodiments, the core comprises InP having an emission wavelength of about 530 nm.

In some embodiments, the core comprises InP having an emission wavelength between about 610 nm and about 650 nm. In some embodiments, the core comprises InP having an absorbance peak of about 630 nm.

In some embodiments, the core is doped. In some embodiments, the dopant of the nanocrystal core comprises a metal, including one or more transition metals. In some embodiments, the dopant is a transition metal selected from the group consisting of Ti, Zr, Hf, V, Nb, Ta, Cr, Mo, W, Mn, Tc, Re, Fe, Ru, Os, Co, Rh, Ir, Ni, Pd, Pt, Cu, Ag, Au, and combinations thereof. In some embodiments, the dopant comprises a non-metal. In some embodiments, the dopant is ZnS, ZnSe, ZnTe, CdSe, CdS, CdTe, HgS, HgSe, HgTe, $CuInS_2$, $CuInSe_2$, AlN, AlP, AlAs, GaN, GaP, or GaAs.

In some embodiments, the core is purified before deposition of a shell. In some embodiments, the core is filtered to remove precipitate from the core solution.

In some embodiments, the diameter of the core is determined using quantum confinement. Quantum confinement in zero-dimensional nanocrystallites, such as quantum dots, arises from the spatial confinement of electrons within the crystallite boundary. Quantum confinement can be observed once the diameter of the material is of the same magnitude as the de Broglie wavelength of the wave function. The electronic and optical properties of nanoparticles deviate substantially from those of bulk materials. A particle behaves as if it were free when the confining dimension is large compared to the wavelength of the particle. During this state, the bandgap remains at its original energy due to a continuous energy state. However, as the confining dimension decreases and reaches a certain limit, typically in nanoscale, the energy spectrum becomes discrete. As a result, the bandgap becomes size-dependent.

Nanostructure Shell

In some embodiments, the nanostructures of the present invention include a core and at least one shell. In some embodiments, the nanostructures of the present invention include a core and at least two shells. The shell can, e.g., increase the quantum yield and/or stability of the nanostructures. In some embodiments, the core and the shell comprise different materials. In some embodiments, the nanostructure comprises shells of different shell material.

In some embodiments, a shell that comprises a mixture of zinc and Group VI elements is deposited onto a core or a core/shell(s) structure. In some embodiments, the shell deposited is a mixture of at least two of a zinc source, a selenium source, a sulfur source, and a tellurium source. In some embodiments, the shell deposited is a mixture of two of a zinc source, a selenium source, a sulfur source, and a tellurium source. In some embodiments, the shell deposited is a mixture of three of a zinc source, a selenium source, a sulfur source, and a tellurium source. In some embodiments, the shell comprises zinc and sulfur; zinc and selenium; zinc, sulfur, and selenium; zinc and tellurium; zinc, tellurium, and sulfur; or zinc, tellurium, and selenium;

In some embodiments, a shell comprises more than one monolayer of shell material. The number of monolayers is an average for all the nanostructures; therefore, the number of monolayers in a shell may be a fraction. In some embodiments, the number of monolayers in a shell is between 0.25 and 10, 0.25 and 8, 0.25 and 7, 0.25 and 6, 0.25 and 5, 0.25 and 4, 0.25 and 3, 0.25 and 2, 2 and 10, 2 and 8, 2 and 7, 2 and 6, 2 and 5, 2 and 4, 2 and 3, 3 and 10, 3 and 8, 3 and 7, 3 and 6, 3 and 5, 3 and 4, 4 and 10, 4 and 8, 4 and 7, 4 and 6, 4 and 5, 5 and 10, 5 and 8, 5 and 7, 5 and 6, 6 and 10, 6 and 8, 6 and 7, 7 and 10, 7 and 8, or 8 and 10. In some embodiments, the shell comprises between 3 and 5 monolayers.

The thickness of the shell can be controlled by varying the amount of precursor provided. For a given shell thickness, at least one of the precursors is optionally provided in an amount whereby, when a growth reaction is substantially complete, a shell of a predetermined thickness is obtained. If more than one different precursor is provided, either the amount of each precursor can be limited or one of the precursors can be provided in a limiting amount while the others are provided in excess.

The thickness of each shell can be determined using techniques known to those of skill in the art. In some embodiments, the thickness of each shell is determined by comparing the average diameter of the nanostructure before and after the addition of each shell. In some embodiments, the average diameter of the nanostructure before and after the addition of each shell is determined by transmission electron microscopy (TEM). In some embodiments, each shell has a thickness of between 0.05 nm and 3.5 nm, 0.05 nm and 2 nm, 0.05 nm and 0.9 nm, 0.05 nm and 0.7 nm, 0.05 nm and 0.5 nm, 0.05 nm and 0.3 nm, 0.05 nm and 0.1 nm, 0.1 nm and 3.5 nm, 0.1 nm and 2 nm, 0.1 nm and 0.9 nm, 0.1 nm and 0.7 nm, 0.1 nm and 0.5 nm, 0.1 nm and 0.3 nm, 0.3 nm and 3.5 nm, 0.3 nm and 2 nm, 0.3 nm and 0.9 nm, 0.3 nm and 0.7 nm, 0.3 nm and 0.5 nm, 0.5 nm and 3.5 nm, 0.5 nm and 2 nm, 0.5 nm and 0.9 nm, 0.5 nm and 0.7 nm, 0.7 nm and 3.5 nm, 0.7 nm and 2 nm, 0.7 nm and 0.9 nm, 0.9 nm and 3.5 nm, 0.9 nm and 2 nm, or 2 nm and 3.5 nm.

In some embodiments, each shell is synthesized in the presence of at least one nanostructure ligand. Ligands can, e.g., enhance the miscibility of nanostructures in solvents or polymers (allowing the nanostructures to be distributed throughout a composition such that the nanostructures do not aggregate together), increase quantum yield of nanostructures, and/or preserve nanostructure luminescence (e.g., when the nanostructures are incorporated into a matrix). In some embodiments, the ligand(s) for the core synthesis and for the shell synthesis are the same. In some embodiments, the ligand(s) for the core synthesis and for the shell synthesis are different. Following synthesis, any ligand on the surface of the nanostructures can be exchanged for a different ligand with other desirable properties. Examples of ligands are disclosed in U.S. Pat. Nos. 7,572,395, 8,143,703, 8,425,803, 8,563,133, 8,916,064, 9,005,480, 9,139,770, and 9,169,435, and in U.S. Patent Appl. Publication No. 2008/0118755.

Ligands suitable for the synthesis of a shell are known by those of skill in the art. In some embodiments, the ligand is a fatty acid selected from the group consisting of lauric acid, caproic acid, caprylic acid, myristic acid, palmitic acid, stearic acid, and oleic acid. In some embodiments, the ligand is an organic phosphine or an organic phosphine oxide selected from trioctylphosphine oxide (TOPO), trioctylphosphine (TOP), diphenylphosphine (DPP), triphenylphosphine oxide, and tributylphosphine oxide. In some embodiments, the ligand is an amine selected from the group consisting of dodecylamine, oleylamine, hexadecylamine, dioctylamine, and octadecylamine. In some embodiments, the ligand is trioctylphosphine, oleic acid, lauric acid, or a combination thereof.

In some embodiments, each shell is produced in the presence of a mixture of ligands.

In some embodiments, each shell is produced in the presence of a mixture comprising 2, 3, 4, 5, or 6 different ligands. In some embodiments, each shell is produced in the presence of a mixture comprising 3 different ligands. In some embodiments, the mixture of ligands comprises tributylphosphine, oleic acid, and oleylamine.

In some embodiments, each shell is produced in the presence of a solvent. In some embodiments, the solvent is selected from the group consisting of 1-octadecene, 1-hexadecene, 1-eicosene, eicosane, octadecane, hexadecane, tetradecane, squalene, squalane, trioctylphosphine oxide, and dioctyl ether.

In some embodiments, a core or a core/shell(s) and shell precursor are admixed at a temperature between 20° C. and 310° C., 20° C. and 280° C., 20° C. and 250° C., 20° C. and 200° C., 20° C. and 150° C., 20° C. and 100° C., 20° C. and 50° C., 50° C. and 310° C., 50° C. and 280° C., 50° C. and 250° C., 50° C. and 200° C., 50° C. and 150° C., 50° C. and 100° C., 100° C. and 310° C., 100° C. and 280° C., 100° C. and 250° C., 100° C. and 200° C., 100° C. and 150° C., 150° C. and 310° C., 150° C. and 280° C., 150° C. and 250° C., 150° C. and 200° C., 200° C. and 310° C., 200° C. and 280° C., 200° C. and 250° C., 250° C. and 310° C., 250° C. and 280° C., or 280° C. and 310° C. In some embodiments, a core or a core/shell(s) and shell precursor are admixed at a temperature between 20° C. and 100° C.

In some embodiments, after admixing a core or core/shell(s) and shell precursor, the temperature of the reaction mixture is increased, maintained, or reduced to a temperature between 200° C. and 310° C., 200° C. and 280° C., 200° C. and 250° C., 200° C. and 220° C., 220° C. and 310° C., 220° C. and 280° C., 220° C. and 250° C., 250° C. and 310° C., 250° C. and 280° C., or 280° C. and 310° C. In some embodiments, after contacting a core or core/shell(s) and shell precursor, the temperature of the reaction mixture is increased, maintained, or reduced to between 200° C. and 310° C.

In some embodiments, after admixing a core or core/shell(s) and shell precursor, the time to reach the temperature is between 2 and 240 minutes, between 2 and 200 minutes, 2 and 100 minutes, 2 and 60 minutes, 2 and 40 minutes, 5 and 240 minutes, 5 and 200 minutes, 5 and 100 minutes, 5 and 60 minutes, 5 and 40 minutes, 10 and 240 minutes, 10 and 200 minutes, 10 and 100 minutes, 10 and 60 minutes, 10 and 40 minutes, 40 and 240 minutes, 40 and 200 minutes, 40 and 100 minutes, 40 and 60 minutes, 60 and 240 minutes, 60 and 200 minutes, 60 and 100 minutes, 100 and 240 minutes, 100 and 200 minutes, or 200 and 240 minutes.

In some embodiments, after admixing a core or core/shell(s) and shell precursor, the temperature of the reaction mixture is maintained for between 2 and 240 minutes, 2 and 200 minutes, 2 and 100 minutes, 2 and 60 minutes, 2 and 40 minutes, 5 and 240 minutes, 5 and 200 minutes, 5 and 100 minutes, 5 and 60 minutes, 5 and 40 minutes, 10 and 240 minutes, 10 and 200 minutes, 10 and 100 minutes, 10 and 60 minutes, 10 and 40 minutes, 40 and 240 minutes, 40 and 200 minutes, 40 and 100 minutes, 40 and 60 minutes, 60 and 240 minutes, 60 and 200 minutes, 60 and 100 minutes, 100 and 240 minutes, 100 and 200 minutes, or 200 and 240 minutes. In some embodiments, after admixing a core or core/shell(s) and shell precursor, the temperature of the reaction mixture is maintained for between 30 and 120 minutes.

In some embodiments, additional shells are produced by further additions of shell material precursors that are added to the reaction mixture followed by maintaining at an elevated temperature. Typically, additional shell precursor is provided after reaction of the previous shell is substantially complete (e.g., when at least one of the previous precursors is depleted or removed from the reaction or when no additional growth is detectable). The further additions of precursor create additional shells.

In some embodiments, the nanostructure is cooled before the addition of additional shell material precursor to provide further shells. In some embodiments, the nanostructure is maintained at an elevated temperature before the addition of shell material precursor to provide further shells.

After sufficient layers of shell have been added for the nanostructure to reach the desired thickness and diameter, the nanostructure can be cooled. In some embodiments, the core/shell(s) nanostructures are cooled to room temperature. In some embodiments, an organic solvent is added to dilute the reaction mixture comprising the core/shell(s) nanostructures.

In some embodiments, the organic solvent used to dilute the reaction mixture is ethanol, hexane, pentane, toluene, benzene, diethylether, acetone, ethyl acetate, dichloromethane (methylene chloride), chloroform, dimethylformamide, or N-methylpyrrolidinone. In some embodiments, the organic solvent is toluene. In some embodiments, the organic solvent is a combination of toluene and ethanol.

In some embodiments, core/shell(s) nanostructures are isolated. In some embodiments, the core/shell(s) nanostructures are isolated by precipitation using an organic solvent. In some embodiments, the core/shell(s) nanostructures are isolated by flocculation with ethanol.

The number of monolayers will determine the size of the core/shell(s) nanostructures.

The size of the core/shell(s) nanostructures can be determined using techniques known to those of skill in the art. In some embodiments, the size of the core/shell(s) nanostructures is determined using TEM. In some embodiments, the core/shell(s) nanostructures have an average diameter of between 1 nm and 15 nm, 1 nm and 10 nm, 1 nm and 9 nm, 1 nm and 8 nm, 1 nm and 7 nm, 1 nm and 6 nm, 1 nm and 5 nm, 5 nm and 15 nm, 5 nm and 10 nm, 5 nm and 9 nm, 5 nm and 8 nm, 5 nm and 7 nm, 5 nm and 6 nm, 6 nm and 15 nm, 6 nm and 10 nm, 6 nm and 9 nm, 6 nm and 8 nm, 6 nm and 7 nm, 7 nm and 15 nm, 7 nm and 10 nm, 7 nm and 9 nm, 7 nm and 8 nm, 8 nm and 15 nm, 8 nm and 10 nm, 8 nm and 9 nm, 9 nm and 15 nm, 9 nm and 10 nm, or 10 nm and 15 nm. In some embodiments, the core/shell(s) nanostructures have an average diameter of between 5 nm and 6 nm.

In some embodiments, at least one shell comprises zinc. In some embodiments, at least two shells comprise zinc. In some embodiments, at least three shells comprise zinc.

Production of a ZnSe Shell

In some embodiments, the shell deposited onto the core or core/shell(s) nanostructure is a ZnSe shell.

In some embodiments, the shell precursors contacted with a core or core/shell(s) nanostructure to prepare a ZnSe shell comprise a zinc source and a selenium source.

In some embodiments, the zinc source is a dialkyl zinc compound. In some embodiments, the zinc source is a zinc carboxylate. In some embodiments, the zinc source is diethylzinc, dimethylzinc, zinc acetate, zinc acetylacetonate, zinc iodide, zinc bromide, zinc chloride, zinc fluoride, zinc carbonate, zinc cyanide, zinc nitrate, zinc dioleate, zinc oxide, zinc peroxide, zinc perchlorate, zinc sulfate, zinc hexanoate, zinc octanoate, zinc laurate, zinc myristate, zinc palmitate, zinc stearate, zinc dithiocarbamate, or mixtures thereof. In some embodiments, the zinc source is zinc oleate, zinc hexanoate, zinc octanoate, zinc laurate, zinc myristate, zinc palmitate, zinc stearate, zinc dithiocarbamate, or mixtures thereof. In some embodiments, the zinc source is zinc dioleate.

In some embodiments, the selenium source is an alkyl-substituted selenourea. In some embodiments, the selenium source is a phosphine selenide. In some embodiments, the selenium source is selected from trioctylphosphine selenide, tri(n-butyl)phosphine selenide, tri(sec-butyl)phosphine selenide, tri(tert-butyl)phosphine selenide, trimethylphosphine selenide, triphenylphosphine selenide, diphenylphosphine selenide, phenylphosphine selenide, tricyclohexylphosphine selenide, cyclohexylphosphine selenide, 1-octaneselenol, 1-dodecaneselenol, selenophenol, elemental selenium, hydrogen selenide, bis(trimethylsilyl) selenide, selenourea, and mixtures thereof. In some embodiments, the selenium source is tri(n-butyl)phosphine selenide, tri(sec-butyl)phosphine selenide, or tri(tert-butyl)phosphine selenide. In some embodiments, the selenium source is trioctylphosphine selenide.

In some embodiments, the molar ratio of core to zinc source to prepare a ZnSe shell is between 1:2 and 1:1000, 1:2 and 1:100, 1:2 and 1:50, 1:2 and 1:25, 1:2 and 1:15, 1:2 and 1:10, 1:2 and 1:5, 1:5 and 1:1000, 1:5 and 1:100, 1:5 and 1:50, 1:5 and 1:25, 1:5 and 1:15, 1:5 and 1:10, 1:10 and 1:1000, 1:10 and 1:100, 1:10 and 1:50, 1:10 and 1:25, 1:10 and 1:15, 1:15 and 1:1000, 1:15 and 1:100, 1:15 and 1:50, 1:15 and 1:25, 1:25 and 1:1000, 1:25 and 1:100, 1:25 and 1:50, 1:50 and 1:1000, 1:50 and 1:100, or 1:100 and 1:1000.

In some embodiments, the zinc source to prepare a ZnS shell is zinc dioleate. In some embodiments, the molar ratio of core to zinc dioleate to prepare a ZnS shell is between 1:2 and 1:1000, 1:2 and 1:100, 1:2 and 1:50, 1:2 and 1:25, 1:2 and 1:15, 1:2 and 1:10, 1:2 and 1:5, 1:5 and 1:1000, 1:5 and 1:100, 1:5 and 1:50, 1:5 and 1:25, 1:5 and 1:15, 1:5 and 1:10, 1:10 and 1:1000, 1:10 and 1:100, 1:10 and 1:50, 1:10 and 1:25, 1:10 and 1:15, 1:15 and 1:1000, 1:15 and 1:100, 1:15 and 1:50, 1:15 and 1:25, 1:25 and 1:1000, 1:25 and 1:100, 1:25 and 1:50, 1:50 and 1:1000, 1:50 and 1:100, or 1:100 and 1:1000. In some embodiments, the molar ratio of core to zinc dioleate to prepare a ZnS shell is between 1:2 and 1:50. In some embodiments, the molar ratio of core to zinc dioleate to prepare a ZnS shell is between 1:20 and 1:30.

In some embodiments, the molar ratio of core to zinc dioleate to prepare a ZnSe shell is between 1:2 and 1:1000, 1:2 and 1:100, 1:2 and 1:50, 1:2 and 1:25, 1:2 and 1:15, 1:2 and 1:10, 1:2 and 1:5, 1:5 and 1:1000, 1:5 and 1:100, 1:5 and 1:50, 1:5 and 1:25, 1:5 and 1:15, 1:5 and 1:10, 1:10 and 1:1000, 1:10 and 1:100, 1:10 and 1:50, 1:10 and 1:25, 1:10 and 1:15, 1:15 and 1:1000, 1:15 and 1:100, 1:15 and 1:50, 1:15 and 1:25, 1:25 and 1:1000, 1:25 and 1:100, 1:25 and 1:50, 1:50 and 1:1000, 1:50 and 1:100, or 1:100 and 1:1000.

In some embodiments, the molar ratio of core to selenium source to prepare a ZnSe shell is between 1:2 and 1:1000, 1:2 and 1:100, 1:2 and 1:50, 1:2 and 1:25, 1:2 and 1:15, 1:2 and 1:10, 1:2 and 1:5, 1:5 and 1:1000, 1:5 and 1:100, 1:5 and 1:50, 1:5 and 1:25, 1:5 and 1:15, 1:5 and 1:10, 1:10 and 1:1000, 1:10 and 1:100, 1:10 and 1:50, 1:10 and 1:25, 1:10 and 1:15, 1:15 and 1:1000, 1:15 and 1:100, 1:15 and 1:50, 1:15 and 1:25, 1:25 and 1:1000, 1:25 and 1:100, 1:25 and 1:50, 1:50 and 1:1000, 1:50 and 1:100, or 1:100 and 1:1000.

In some embodiments, the number of monolayers in a ZnSe shell is between 0.25 and 10, 0.25 and 8, 0.25 and 7, 0.25 and 6, 0.25 and 5, 0.25 and 4, 0.25 and 3, 0.25 and 2, 2 and 10, 2 and 8, 2 and 7, 2 and 6, 2 and 5, 2 and 4, 2 and 3, 3 and 10, 3 and 8, 3 and 7, 3 and 6, 3 and 5, 3 and 4, 4 and 10, 4 and 8, 4 and 7, 4 and 6, 4 and 5, 5 and 10, 5 and 8, 5 and 7, 5 and 6, 6 and 10, 6 and 8, 6 and 7, 7 and 10, 7 and 8, or 8 and 10. In some embodiments, the ZnSe shell comprises between 2 and 6 monolayers. In some embodiments, the ZnSe shell comprises between 3 and 5 monolayers.

In some embodiments, a ZnSe monolayer has a thickness of about 0.328 nm.

In some embodiments, a ZnSe shell has a thickness of between 0.08 nm and 3.5 nm, 0.08 nm and 2 nm, 0.08 nm and 0.9 nm, 0.08 nm and 0.7 nm, 0.08 nm and 0.5 nm, 0.08 nm and 0.2 nm, 0.2 nm and 3.5 nm, 0.2 nm and 2 nm, 0.2 nm and 0.9 nm, 0.2 nm and 0.7 nm, 0.2 nm and 0.5 nm, 0.5 nm and 3.5 nm, 0.5 nm and 2 nm, 0.5 nm and 0.9 nm, 0.5 nm and 0.7 nm, 0.7 nm and 3.5 nm, 0.7 nm and 2 nm, 0.7 nm and 0.9 nm, 0.9 nm and 3.5 nm, 0.9 nm and 2 nm, or 2 nm and 3.5 nm.

Production of a ZnS Shell

In some embodiments, the shell deposited onto the core or core/shell(s) nanostructure is a ZnS shell.

In some embodiments, the shell precursors contacted with a core or core/shell(s) nanostructure to prepare a ZnS shell comprise a zinc source and a sulfur source.

In some embodiments, the zinc source is a dialkyl zinc compound. In some embodiments, the zinc source is a zinc carboxylate. In some embodiments, the zinc source is diethylzinc, dimethylzinc, zinc acetate, zinc acetylacetonate, zinc iodide, zinc bromide, zinc chloride, zinc fluoride, zinc carbonate, zinc cyanide, zinc nitrate, zinc oleate, zinc oxide, zinc peroxide, zinc perchlorate, zinc sulfate, zinc hexanoate, zinc octanoate, zinc laurate, zinc myristate, zinc palmitate, zinc stearate, zinc dithiocarbamate, or mixtures thereof. In some embodiments, the zinc source is zinc dioleate, zinc hexanoate, zinc octanoate, zinc laurate, zinc myristate, zinc palmitate, zinc stearate, zinc dithiocarbamate, or mixtures thereof. In some embodiments, the zinc source is zinc dioleate.

In some embodiments, the sulfur source is selected from elemental sulfur, octanethiol, dodecanethiol, octadecanethiol, tributylphosphine sulfide, cyclohexyl isothiocyanate, α-toluenethiol, ethylene trithiocarbonate, allyl mercaptan, bis(trimethylsilyl) sulfide, trioctylphosphine sulfide, and mixtures thereof. In some embodiments, the sulfur source is an alkyl-substituted zinc dithiocarbamate. In some embodiments, the sulfur source is octanethiol. In some embodiments, the sulfur source is tributylphosphine sulfide.

In some embodiments, the molar ratio of core to zinc source to prepare a ZnS shell is between 1:2 and 1:1000, 1:2 and 1:100, 1:2 and 1:50, 1:2 and 1:25, 1:2 and 1:15, 1:2 and 1:10, 1:2 and 1:5, 1:5 and 1:1000, 1:5 and 1:100, 1:5 and 1:50, 1:5 and 1:25, 1:5 and 1:15, 1:5 and 1:10, 1:10 and 1:1000, 1:10 and 1:100, 1:10 and 1:50, 1:10 and 1:25, 1:10 and 1:15, 1:15 and 1:1000, 1:15 and 1:100, 1:15 and 1:50, 1:15 and 1:25, 1:25 and 1:1000, 1:25 and 1:100, 1:25 and 1:50, 1:50 and 1:1000, 1:50 and 1:100, or 1:100 and 1:1000.

In some embodiments, the zinc source to prepare a ZnS shell is zinc dioleate. In some embodiments, the molar ratio of core to zinc dioleate to prepare a ZnS shell is between 1:2 and 1:1000, 1:2 and 1:100, 1:2 and 1:50, 1:2 and 1:25, 1:2 and 1:15, 1:2 and 1:10, 1:2 and 1:5, 1:5 and 1:1000, 1:5 and 1:100, 1:5 and 1:50, 1:5 and 1:25, 1:5 and 1:15, 1:5 and 1:10, 1:10 and 1:1000, 1:10 and 1:100, 1:10 and 1:50, 1:10 and 1:25, 1:10 and 1:15, 1:15 and 1:1000, 1:15 and 1:100, 1:15 and 1:50, 1:15 and 1:25, 1:25 and 1:1000, 1:25 and 1:100, 1:25 and 1:50, 1:50 and 1:1000, 1:50 and 1:100, or 1:100 and 1:1000. In some embodiments, the molar ratio of core to zinc dioleate to prepare a ZnS shell is between 1:2 and 1:50. In some embodiments, the molar ratio of core to zinc dioleate to prepare a ZnS shell is between 1:20 and 1:30.

In some embodiments, the molar ratio of core to sulfur source to prepare a ZnS shell is between 1:2 and 1:1000, 1:2 and 1:100, 1:2 and 1:50, 1:2 and 1:25, 1:2 and 1:15, 1:2 and 1:10, 1:2 and 1:5, 1:5 and 1:1000, 1:5 and 1:100, 1:5 and 1:50, 1:5 and 1:25, 1:5 and 1:15, 1:5 and 1:10, 1:10 and 1:1000, 1:10 and 1:100, 1:10 and 1:50, 1:10 and 1:25, 1:10 and 1:15, 1:15 and 1:1000, 1:15 and 1:100, 1:15 and 1:50, 1:15 and 1:25, 1:25 and 1:1000, 1:25 and 1:100, 1:25 and 1:50, 1:50 and 1:1000, 1:50 and 1:100, or 1:100 and 1:1000.

In some embodiments, the number of monolayers in a ZnS shell is between 0.25 and 10, 0.25 and 8, 0.25 and 7, 0.25 and 6, 0.25 and 5, 0.25 and 4, 0.25 and 3, 0.25 and 2, 2 and 10, 2 and 8, 2 and 7, 2 and 6, 2 and 5, 2 and 4, 2 and 3, 3 and 10, 3 and 8, 3 and 7, 3 and 6, 3 and 5, 3 and 4, 4 and 10, 4 and 8, 4 and 7, 4 and 6, 4 and 5, 5 and 10, 5 and 8, 5 and 7, 5 and 6, 6 and 10, 6 and 8, 6 and 7, 7 and 10, 7 and 8, or 8 and 10. In some embodiments, the ZnS shell comprises between 2 and 12 monolayers. In some embodiments, the ZnS shell comprises between 4 and 6 monolayers.

In some embodiments, a ZnS monolayer has a thickness of about 0.31 nm.

In some embodiments, a ZnS shell has a thickness of between 0.08 nm and 3.5 nm, 0.08 nm and 2 nm, 0.08 nm and 0.9 nm, 0.08 nm and 0.7 nm, 0.08 nm and 0.5 nm, 0.08 nm and 0.2 nm, 0.2 nm and 3.5 nm, 0.2 nm and 2 nm, 0.2 nm and 0.9 nm, 0.2 nm and 0.7 nm, 0.2 nm and 0.5 nm, 0.5 nm and 3.5 nm, 0.5 nm and 2 nm, 0.5 nm and 0.9 nm, 0.5 nm and 0.7 nm, 0.7 nm and 3.5 nm, 0.7 nm and 2 nm, 0.7 nm and 0.9 nm, 0.9 nm and 3.5 nm, 0.9 nm and 2 nm, or 2 nm and 3.5 nm.

One Pot Production of Nanostructures Comprising Two Shell Layers

In some embodiments, at least two shells are deposited onto the InP core in a single reaction vessel. In some embodiments, at least two shells are deposited onto the InP core, wherein at least one shell comprises zinc.

In some embodiments, the shell precursors contacted with the InP core comprise a zinc source, a sulfur source, and a selenium source.

In some embodiments, a nanostructure comprising InP and at least two shells, wherein at least two shells comprise zinc is produced by a method comprising:
(a) admixing a zinc source and a core comprising InP;
(b) admixing (a) with an organic acid;
(c) admixing (b) with at least one shell precursor;
(d) raising, lowering, or maintaining the temperature to between about 200° C. and about 310° C.;
(e) admixing (d) with at least one shell precursor, wherein the at least one shell precursor is different from the shell precursor in (c); and
(f) raising, lowering, or maintaining the temperature to between about 200° C. and about 310° C.

In some embodiments, the method further comprises admixing (a) with at least one metal halide. In some embodiments, the method further comprises admixing (b) with at least one metal halide. In some embodiments, the method further comprises admixing (f) with at least one metal halide. In some embodiments, the method further comprises admixing (a) with at least one metal halide and admixing (b) with at least one metal halide. In some embodiments, the method further comprises admixing (b) with at least one metal halide and admixing (f) with at least one metal halide. In some embodiments, the method further comprises admixing (a) with at least one metal halide and admixing (f) with at least one metal halide. In some embodiments, the method further comprises admixing (a) with at least one metal halide, admixing (b) with at least one metal halide, and admixing (f) with at least one metal halide.

In some embodiments, a nanostructure comprising InP and at least two shells, wherein at least two shells comprise zinc is produced by a method comprising:
(a) admixing a zinc source, a core comprising InP, and at least one metal halide;
(b) admixing (a) with an organic acid;
(c) admixing (b) with at least one shell precursor;
(d) raising, lowering, or maintaining the temperature to between about 200° C. and about 310° C.;
(e) admixing (d) with at least one shell precursor, wherein the at least one shell precursor is different from the shell precursor in (c); and
(f) raising, lowering, or maintaining the temperature to between about 200° C. and about 310° C.

In some embodiments, the method further comprises admixing (b) with at least one metal halide. In some embodiments, the method further comprises admixing (f) with at least one metal halide. In some embodiments, the method further comprises admixing (b) with at least one metal halide and admixing (f) with at least one metal halide.

In some embodiments, the zinc source is a dialkyl zinc compound. In some embodiments, the zinc source is a zinc carboxylate. In some embodiments, the zinc source is diethylzinc, dimethylzinc, zinc acetate, zinc acetylacetonate, zinc iodide, zinc bromide, zinc chloride, zinc fluoride, zinc carbonate, zinc cyanide, zinc nitrate, zinc oleate, zinc oxide, zinc peroxide, zinc perchlorate, zinc sulfate, zinc hexanoate, zinc octanoate, zinc laurate, zinc myristate, zinc palmitate, zinc stearate, zinc dithiocarbamate, or mixtures thereof. In some embodiments, the zinc source is zinc dioleate, zinc hexanoate, zinc octanoate, zinc laurate, zinc myristate, zinc palmitate, zinc stearate, zinc dithiocarbamate, or mixtures thereof. In some embodiments, the zinc source is zinc dioleate. In some embodiments, the zinc source is in situ produced zinc dioleate.

In some embodiments, the sulfur source is selected from the group consisting of elemental sulfur, octanethiol, dodecanethiol, octadecanethiol, tributylphosphine sulfide, cyclohexyl isothiocyanate, α-toluenethiol, ethylene trithiocarbonate, allyl mercaptan, bis(trimethylsilyl) sulfide, trioctylphosphine sulfide, and combinations thereof. In some embodiments, the sulfur source is an alkyl-substituted zinc dithiocarbamate. In some embodiments, the sulfur source is octanethiol. In some embodiments, the sulfur source is tributylphosphine sulfide.

In some embodiments, the selenium source is an alkyl-substituted selenourea. In some embodiments, the selenium source is a phosphine selenide. In some embodiments, the selenium source is selected from trioctylphosphine selenide, tri(n-butyl)phosphine selenide, tri(sec-butyl)phosphine selenide, tri(tert-butyl)phosphine selenide, trimethylphosphine selenide, triphenylphosphine selenide, diphenylphosphine selenide, phenylphosphine selenide, tricyclohexylphosphine selenide, cyclohexylphosphine selenide, 1-octaneselenol, 1-dodecaneselenol, selenophenol, elemental selenium, hydrogen selenide, bis(trimethylsilyl) selenide, selenourea, and combinations thereof. In some embodiments, the selenium source is tri(n-butyl)phosphine selenide, tri(sec-butyl)

phosphine selenide, or tri(tert-butyl)phosphine selenide. In some embodiments, the selenium source is trioctylphosphine selenide.

In some embodiments, the molar ratio of InP core to zinc source is between 1:2 and 1:1000, 1:2 and 1:100, 1:2 and 1:50, 1:2 and 1:25, 1:2 and 1:15, 1:2 and 1:10, 1:2 and 1:5, 1:5 and 1:1000, 1:5 and 1:100, 1:5 and 1:50, 1:5 and 1:25, 1:5 and 1:15, 1:5 and 1:10, 1:10 and 1:1000, 1:10 and 1:100, 1:10 and 1:50, 1:10 and 1:25, 1:10 and 1:15, 1:15 and 1:1000, 1:15 and 1:100, 1:15 and 1:50, 1:15 and 1:25, 1:25 and 1:1000, 1:25 and 1:100, 1:25 and 1:50, 1:50 and 1:1000, 1:50 and 1:100, or 1:100 and 1:1000.

In some embodiments, the zinc source is zinc dioleate. In some embodiments, the zinc source is in situ prepared zinc dioleate. In some embodiments, the molar ratio of InP core to zinc dioleate is between 1:2 and 1:1000, 1:2 and 1:100, 1:2 and 1:50, 1:2 and 1:25, 1:2 and 1:15, 1:2 and 1:10, 1:2 and 1:5, 1:5 and 1:1000, 1:5 and 1:100, 1:5 and 1:50, 1:5 and 1:25, 1:5 and 1:15, 1:5 and 1:10, 1:10 and 1:1000, 1:10 and 1:100, 1:10 and 1:50, 1:10 and 1:25, 1:10 and 1:15, 1:15 and 1:1000, 1:15 and 1:100, 1:15 and 1:50, 1:15 and 1:25, 1:25 and 1:1000, 1:25 and 1:100, 1:25 and 1:50, 1:50 and 1:1000, 1:50 and 1:100, or 1:100 and 1:1000. In some embodiments, the molar ratio of InP core to zinc dioleate is between 1:2 and 1:50. In some embodiments, the molar ratio of InP core to zinc dioleate is between 1:20 and 1:30.

In some embodiments, the molar ratio of InP core to sulfur source is between 1:2 and 1:1000, 1:2 and 1:100, 1:2 and 1:50, 1:2 and 1:25, 1:2 and 1:15, 1:2 and 1:10, 1:2 and 1:5, 1:5 and 1:1000, 1:5 and 1:100, 1:5 and 1:50, 1:5 and 1:25, 1:5 and 1:15, 1:5 and 1:10, 1:10 and 1:1000, 1:10 and 1:100, 1:10 and 1:50, 1:10 and 1:25, 1:10 and 1:15, 1:15 and 1:1000, 1:15 and 1:100, 1:15 and 1:50, 1:15 and 1:25, 1:25 and 1:1000, 1:25 and 1:100, 1:25 and 1:50, 1:50 and 1:1000, 1:50 and 1:100, or 1:100 and 1:1000.

In some embodiments, the temperature of the reaction mixture in (d) is between 200° C. and 310° C., 200° C. and 280° C., 200° C. and 250° C., 200° C. and 220° C., 220° C. and 310° C., 220° C. and 280° C., 220° C. and 250° C., 250° C. and 310° C., 250° C. and 280° C., or 280° C. and 310° C. In some embodiments, the temperature of reaction mixture in (d) is between 250° C. and 310° C.

In some embodiments, the time to reach the temperature in (d) is between 2 and 240 minutes, between 2 and 200 minutes, 2 and 100 minutes, 2 and 60 minutes, 2 and 40 minutes, 5 and 240 minutes, 5 and 200 minutes, 5 and 100 minutes, 5 and 60 minutes, 5 and 40 minutes, 10 and 240 minutes, 10 and 200 minutes, 10 and 100 minutes, 10 and 60 minutes, 10 and 40 minutes, 40 and 240 minutes, 40 and 200 minutes, 40 and 100 minutes, 40 and 60 minutes, 60 and 240 minutes, 60 and 200 minutes, 60 and 100 minutes, 100 and 240 minutes, 100 and 200 minutes, or 200 and 240 minutes.

In some embodiments, the temperature in (d) is maintained for between 2 and 240 minutes, 2 and 200 minutes, 2 and 100 minutes, 2 and 60 minutes, 2 and 40 minutes, 5 and 240 minutes, 5 and 200 minutes, 5 and 100 minutes, 5 and 60 minutes, 5 and 40 minutes, 10 and 240 minutes, 10 and 200 minutes, 10 and 100 minutes, 10 and 60 minutes, 10 and 40 minutes, 40 and 240 minutes, 40 and 200 minutes, 40 and 100 minutes, 40 and 60 minutes, 60 and 240 minutes, 60 and 200 minutes, 60 and 100 minutes, 100 and 240 minutes, 100 and 200 minutes, or 200 and 240 minutes. In some embodiments, after admixing a core or core/shell(s) and shell precursor, the temperature of the reaction mixture is maintained for between 30 and 120 minutes.

In some embodiments, the temperature in (f) is between 200° C. and 310° C., 200° C. and 280° C., 200° C. and 250° C., 200° C. and 220° C., 220° C. and 310° C., 220° C. and 280° C., 220° C. and 250° C., 250° C. and 310° C., 250° C. and 280° C., or 280° C. and 310° C. In some embodiments, the temperature in (f) is between 250° C. and 100° C.

In some embodiments, the time to reach the temperature in (f) is between 2 and 240 minutes, between 2 and 200 minutes, 2 and 100 minutes, 2 and 60 minutes, 2 and 40 minutes, 5 and 240 minutes, 5 and 200 minutes, 5 and 100 minutes, 5 and 60 minutes, 5 and 40 minutes, 10 and 240 minutes, 10 and 200 minutes, 10 and 100 minutes, 10 and 60 minutes, 10 and 40 minutes, 40 and 240 minutes, 40 and 200 minutes, 40 and 100 minutes, 40 and 60 minutes, 60 and 240 minutes, 60 and 200 minutes, 60 and 100 minutes, 100 and 240 minutes, 100 and 200 minutes, or 200 and 240 minutes.

In some embodiments, the temperature in (f) is maintained for between 2 and 240 minutes, 2 and 200 minutes, 2 and 100 minutes, 2 and 60 minutes, 2 and 40 minutes, 5 and 240 minutes, 5 and 200 minutes, 5 and 100 minutes, 5 and 60 minutes, 5 and 40 minutes, 10 and 240 minutes, 10 and 200 minutes, 10 and 100 minutes, 10 and 60 minutes, 10 and 40 minutes, 40 and 240 minutes, 40 and 200 minutes, 40 and 100 minutes, 40 and 60 minutes, 60 and 240 minutes, 60 and 200 minutes, 60 and 100 minutes, 100 and 240 minutes, 100 and 200 minutes, or 200 and 240 minutes.

Acid Etching of the Cores

In some embodiments, the cores are etched with acid prior to depositing one or more shells onto the cores. In some embodiments, the core comprising InP is etched in (a).

In some embodiments, the acid used in the etching is an organic acid. In some embodiments, the organic acid is a carboxylic acid, a phosphonic acid, or a sulfonic acid.

In some embodiments, the acid used in the etching is lauric acid, hexanoic acid, oleic acid, trifluoromethanesulfonic acid, octyl phosphonic acid, 2-ethylhexanoic acid, myristic acid, decanoic acid, palmitic acid, stearic acid, linoleic acid, or mixtures thereof. In some embodiments, the acid used in the etching is oleic acid.

In some embodiments, the concentration of the acid used in the etching is between 0.1 M and 5 M, between 0.1 M and 4 M, between 0.1 M and 3 M, between 0.1 M and 2 M, between 0.1 M and 2 M, between 0.5 M and 5 M, between 0.5 M and 4 M, between 0.5 M and 3 M, between 0.5 M and 2 M, between 0.5 M and 1 M, between 1 M and 5 M, between 1 M and 4 M, between 1 M and 3 M, between 1 M and 2 M, between 2 M and 5 M, between 2 M and 4 M, between 2 M and 3 M, between 3 M and 5 M, between 3 M and 4 M, or between 4 M and 5 M.

In some embodiments, the molar ratio of the InP core to the acid is between about 1:1 and about 1:1000. In some embodiments, the molar ratio of the InP core to the acid is between about 1:1 and about 1:1000, between about 1:1 to about 1:500, between about 1:1 to about 1:250, between about 1:1 to about 1:100, between about 1:1 to about 1:50, between about 1:2 to about 1:1000, between about 1:2 to about 1:500, between about 1:2 to about 1:250, between about 1:2 to about 1:100, between about 1:2 to about 1:50, between about 1:5 and about 1:1000, between about 1:5 to about 1:500, between about 1:5 to about 1:250, between about 1:5 to about 1:100, between about 1:5 to about 1:50, between about 1:10 to about 1:1000, between about 1:10 to about 1:500, between about 1:10 to about 1:250, between about 1:10 to about 1:100, or between about 1:10 to about 1:50. In some embodiments, the molar ratio of the InP core to the acid is between about 1:5 and about 1:20.

In Situ Production of Zinc Dioleate

In some embodiments, the metal carboxylate is a zinc carboxylate. In some embodiments, the zinc carboxylate is zinc dioleate. In some embodiments, the zinc carboxylate is in situ prepared zinc dioleate.

When zinc dioleate is used as the zinc carboxylate, the synthesis of InP/ZnSe/ZnS core/shell nanostructures relies heavily on the purity of the zinc dioleate precursor. In particular, the quality of the nanostructures is closely related to the quality of the zinc dioleate. Commercially available zinc dioleate has been found to produce nanostructures with poor quantum yield. And, commercially available zinc dioleate is very sensitive to storage conditions and time. Zinc dioleate does not have a well-defined crystal structure and is very sensitive to moisture.

Zinc dioleate is relatively chemically unstable. It is presumed that water can hydrate zinc dioleate and release oleic acid and partially form $Zn(OH)_x$, wherein $0<x<2$. In fact, a classical reaction for the production of ZnO nanocrystals is to hydrate zinc carboxylates. This reaction is performed at ambient temperature which demonstrates that it is a spontaneous process with very negative free Gibbs energy. This can explain why zinc dioleate is so sensitive to moisture. It has been found that moisture contaminated zinc dioleate used in the shelling process of InP quantum dots results in a drastic decrease in quantum yield. Therefore, it is important to avoid moisture to increase the quantum yield of InP quantum dots comprising at least one shell prepared using zinc dioleate.

Metal Halide

In some embodiments, the method of producing a nanostructure comprising InP and at least two shells, wherein at least two shells comprise zinc comprises at least one metal halide. In some embodiments, the method comprises 1, 2, 3, 4, 5, or 6 metal halides. In some embodiments, the method of producing a nanostructure comprising InP and at least two shells, wherein at least two shells comprise zinc comprises 1 metal halide.

In some embodiments, the at least one metal halide is selected from the group consisting of LiF, NaF, KF, CuF, AgF, AuF, CuCl, AgCl, LiCl, NaCl, KCl, LiBr, CuBr, AgBr, AuBr, NaBr, KBr, CuI, AgI, AuI, LiI, NaI, KI, $BeF_2$, $MgF_2$, $CaF_2$, $SrF_2$, $SnF_2$, $PbF_2$, $ZnF_2$, $HgF_2$, $BeCl_2$, $MgCl_2$, $CaCl_2$, $SrCl_2$, $SnCl_2$, $PbCl_2$, $ZnCl_2$, $HgCl_2$, $BeBr_2$, $MgBr_2$, $CaBr_2$, $SrBr_2$, $ZnBr_2$, $HgBr_2$, $SnBr_2$, $PbBr_2$, $BeI_2$, $MgI_2$, $CaI_2$, $SrI_2$, $ZnI_2$, $HgI_2$, $SnI_2$, $PbI_2$, $AlF_3$, $GaF_3$, $InF_3$, $YF_3$, $AlCl_3$, $GaCl_3$, $InCl_3$, $YCl_3$, $AlBr_3$, $GaBr_3$, $InBr_3$, $YBr_3$, $AlI_3$, $GaI_3$, $InI_3$, $YI_3$, $ZrF_4$, $TiF_4$, $HfF_4$, $ZrCl_4$, $TiCl_4$, $HfCl_4$, $ZrBr_4$, $TiBr_4$, $HfBr_4$, $ZrI_4$, $TiI_4$, $HfI_4$, and combinations thereof.

In some embodiments, the at least one metal halide is selected from the group consisting of $ZnBr_2$, $ZnCl_2$, $GaCl_3$, $ZrCl_4$, $AlCl_3$, $YCl_3$, or $MgBr_2$.

In some embodiments, the at least one metal halide is $ZnCl_2$. In some embodiments, the at least one metal halide is $GaCl_3$ and $ZnBr_2$. In some embodiments, the at least one metal halide is $ZrCl_4$. In some embodiments, the at least one metal halide is $AlCl_3$ and $ZnBr_2$. In some embodiments, the at least one metal halide is $ZrCl_4$, $YCl_3$, and $MgBr_2$. In some embodiments, the at least one metal halide is $ZrCl_4$ and $YCl_3$.

Concentration of Metal Halide

The concentration of the at least one metal halide in the nanostructure can be determined by optical density (OD) measurement. OD can be measured at 450 nm using a 1 cm path length cuvette. For a 100 µL nanostructure with an $OD_{450}=1.5$, the concentration of the at least one metal halide is between about 0.01 mM and about 40 mM, about 0.01 mM and about 20 mM, about 0.01 mM and about 10 mM, about 0.01 mM and about 5 mM, about 0.01 mM and about 2.5 mM, about 0.01 mM and about 1.5 mM, about 0.01 mM and about 1 mM, about 0.01 mM and about 0.5 mM, about 0.01 mM and about 0.25 mM, about 0.25 mM and about 40 mM, about 0.25 mM and about 20 mM, about 0.25 mM and about 10 mM, about 0.25 mM and about 5 mM, about 0.25 mM and about 2.5 mM, about 0.25 mM and about 1.5 mM, about 0.25 mM and about 1.5 mM, about 0.25 mM and about 1 mM, about 0.25 mM and about 0.5 mM, about 0.25 mM and about 0.25 mM, about 0.5 mM and about 40 mM, about 0.5 mM and about 20 mM, about 0.5 mM and about 10 mM, about 0.5 mM and about 5 mM, about 0.5 mM and about 2.5 mM, about 0.5 mM and about 1.5 mM, about 0.5 mM and about 1 mM, about mM and about 40 mM, about 1 mM and about 20 mM, about 1 mM and about 10 mM, about 1 mM and about 5 mM, about 1 mM and about 2.5 mM, about 1 mM and about 1.5 mM, about 1.5 mM and about 40 mM, about 1.5 mM and about 20 mM, about 1.5 mM and about 10 mM, about 1.5 mM and about 5 mM, about 1.5 mM and about 2.5 mM, about 2.5 mM and about 40 mM, about 2.5 mM and about 20 mM, about 2.5 mM and about 10 mM, about 2.5 mM and about 5 mM, about 5 mM and about 40 mM, about 5 mM and about 20 mM, about 5 mM and about 10 mM, about 10 mM and about 40 mM, about 10 mM and about 20 mM, or about 20 mM and about 40 mM. For a 100 µL nanostructure with an $OD_{450}=1.5$, the concentration of the at least one metal halide is between about 1 mM and about 2.5 mM.

Ratio of Metal Halide to Core Comprising InP

In some embodiments, the molar ratio of the at least one metal halide to the InP core is between about 1:1 and about 1:8, about 1:1 and about 1:7, 1:1 and about 1:6, about 1:1 and about 1:5, about 1:1 and about 1:4, about 1:1 and about 1:3, about 1:1 and about 1:2, about 1:2 and about 1:8, about 1:2 and about 1:7, about 1:2 and about 1:6, about 1:2 and about 1:5, about 1:2 and about 1:4, about 1:2 and about 1:3, about 1:3 and about 1:8, about 1:3 and about 1:7, about 1:3 and about 1:6, about 1:3 and about 1:5, about 1:3 and about 1:4, about 1:4 and about 1:8, about 1:4 and about 1:7, about 1:4 and about 1:6, about 1:4 and about 1:5, about 1:5 and about 1:8, about 1:5 and about 1:7, about 1:5 and about 1:6, about 1:6 and about 1:8, about 1:6 and about 1:7, or about 1:7 and about 1:8. In some embodiments, the molar ratio of the at least one metal halide to InP core is between about 1:1 and about 1:3.

Core/Shell(s) Nanostructures

In some embodiments, the core/shell(s) nanostructure is prepared using the method of U.S. Application Publication No. 2017/0306227, which is incorporated by reference in its entirety.

In some embodiments, the core/shell(s) nanostructure is an InP/ZnSe/ZnS nanostructure.

Solvents

In some embodiments, the method of producing a nanostructure comprising InP and at least two shells, wherein at least two shells comprise zinc further comprises a solvent.

In some embodiments, the solvent is selected from the group consisting of chloroform, acetone, hexane, heptane, butanone, ethylene glycol monoethyl ether, ethylene glycol monopropyl ether, 1,4-butanediol diacetate, diethylene glycol monobutyl ether acetate, ethylene glycol monobutyl ether acetate, glyceryl triacetate, heptyl acetate, hexyl acetate, pentyl acetate, butyl acetate, ethyl acetate, diethylene glycol butyl methyl ether, diethylene glycol monobutyl ether, di(proyplene glycol) dimethyl ether, diethylene glycol ethyl methyl ether, ethylene glycol monobutyl ether, diethylene glycol diethyl ether, methyl ethyl ketone, methyl isobutyl ketone, monomethyl ether glycol ester, gamma-butyrolactone, methylacetic-3-ethyl ether, butyl carbitol, butyl carbitol acetate, propanediol monomethyl ether, propanediol monomethyl ether acetate, cyclohexane, toluene, xylene, isopropyl alcohol, and combinations thereof. In some embodiments, the solvent is hexane, heptane, toluene, or chloroform.

Improved Properties of Nanostructures

In some embodiments, the core/shell(s) nanostructures prepared using the methods described herein display high photoluminescence quantum yield. In some embodiments, the core/shell(s) nanostructures can have a photoluminescence quantum yield of between 60% and 100%, between 60% and 95%, between 60% and 90%, between 60% and 85%, between 60% and 80%, between 60% and 70%, between 70% and 100%, between 70% and 95%, between 70% and 90%, between 70% and 85%, between 70% and 80%, between 80% and 100%, between 80% and 95%, between 80% to 90%, between 80% and 85%, between 85% and 100%, between 85% and 95%, between 80% and 85%, between 85% and 100%, between 85% and 90%, between 90% and 100%, between 90% and 95%, or between 95% and 100%. In some embodiments, the core/shell(s) nanostructures prepared using the methods described herein have a photoluminescence quantum yield of between 95% and 98%.

The photoluminescence spectrum of the core/shell(s) nanostructures prepared using the methods described herein can cover essentially any desired portion of the spectrum. In some embodiments, the photoluminescence spectrum for the core/shell(s) nanostructures have a emission maximum between 300 nm and 750 nm, between 300 nm and 650 nm, between 300 nm and 550 nm, between 300 nm and 450 nm, between 450 nm and 750 nm, between 450 nm and 650 nm, between 450 nm and 550 nm, between 450 nm and 750 nm, between 450 nm and 650 nm, between 450 nm and 550 nm, between 550 nm and 750 nm, between 550 nm and 650 nm, or between 650 nm and 750 nm. In some embodiments, the photoluminescence spectrum for the core/shell(s) nanostructures have an emission maximum of between 500 nm and 550 nm. In some embodiments, the photoluminescence spectrum for the core/shell(s) nanostructures prepared using the methods described herein have an emission maximum of between 600 nm and 650 nm.

The size distribution of the core/shell(s) nanostructures prepared using the methods described herein can be relatively narrow. In some embodiments, the photoluminescence spectrum of the population or core/shell(s) nanostructures prepared using the methods described herein have a full width at half maximum of between 10 nm and 60 nm, between 10 nm and 40 nm, between 10 nm and 30 nm, between 10 nm and 20 nm, between 20 nm and 60 nm, between 20 nm and 40 nm, between 20 nm and 30 nm, between 30 nm and 60 nm, between 30 nm and 40 nm, or between 40 nm and 60 nm. In some embodiments, the photoluminescence spectrum of the population or core/shell(s) nanostructures prepared using the methods described herein have a full width at half maximum of between 35 nm and 45 nm.

Nanostructure Film

In some embodiments, the core/shell(s) nanostructures prepared by the method described herein are incorporated into a nanostructure film. In some embodiments, the nanostructure film is incorporated into a quantum dot enhancement film (QDEF).

In some embodiments, the present disclosure provides a nanostructure film comprising at least one population of nanostructures, the nanostructures a core comprising indium phosphide and at least two shells, wherein at least one of the shells comprises zinc, wherein the nanostructure displays a photoluminescence quantum yield between about 90% and about 100%, and a wherein the nanostructure has a full width at half-maximum of less than 45 nm.

In some embodiments, the nanostructure is a quantum dot.

In some embodiments, the present disclosure provides a nanostructure film comprising:

(a) at least one population of nanostructures, the nanostructures comprising a core comprising indium phosphide and at least two shells, wherein at least one of the shells comprises zinc, wherein the nanostructure displays a photoluminescence quantum yield between about 90% and about 100%, and a wherein the nanostructure has a full width at half-maximum of less than 45 nm; and (b) at least one organic resin.

In some embodiments, the nanostructure is a quantum dot.

In some embodiments, the core/shell(s) nanostructures are embedded in a matrix. As used herein, the term "embedded" is used to indicate that the nanostructures are enclosed or encased within a matrix material that makes up the majority component of the matrix. In some embodiments, the nanostructures are uniformly distributed throughout the matrix material. In some embodiments, the nanostructures are distributed according to an application-specific uniformity distribution function.

In some embodiments, the nanostructures can include a homogenous population having sizes that emit in the blue visible wavelength spectrum, in the green visible wavelength spectrum, or in the red visible wavelength spectrum. In some embodiments, the nanostructures can include a first population of nanostructures having sizes that emit in the blue visible wavelength spectrum, a second population of nanostructures having sizes that emit in the green visible wavelength spectrum, and a third population of nanostructures having sizes that emit in the red visible wavelength spectrum.

The matrix material can be any suitable host matrix material capable of housing nanostructures. Suitable matrix materials can be chemically and optically compatible with nanostructures and any surrounding packaging materials or layers used in applying a nanostructure film to devices. Suitable matrix materials can include non-yellowing optical materials that are transparent to both the primary and secondary light, thereby allowing for both primary and secondary light to transmit through the matrix material. Matrix materials can include polymers and organic and inorganic oxides. Suitable polymers for use in the matrix material can be any polymer known to the ordinarily skilled artisan that can be used for such a purpose. The polymer can be substantially translucent or substantially transparent. Matrix materials can include, but not limited to, epoxies, acrylates, norbornene, polyethylene, poly(vinyl butyral): poly(vinyl acetate), polyurea, polyurethanes; silicones and silicone derivatives including, but not limited to, amino silicone (AMS), polyphenylmethylsiloxane, polyphenylalkylsiloxane, polydiphenylsiloxane, polydialkylsiloxane, silsesquioxanes, fluorinated silicones, and vinyl and hydride substituted silicones; acrylic polymers and copolymers formed from monomers including, but not limited to, methylmethacrylate, butylmethacrylate, and laurylmethacrylate; styrene-based polymers such as polystyrene, amino polystyrene (APS), and poly(acrylonitrile ethylene styrene) (AES); polymers that are cross-linked with bifunctional monomers, such as divinylbenzene; cross-linkers suitable for cross-linking ligand materials, epoxides that combine with ligand amines (e.g., APS or polyethylene imine ligand amines) to form epoxy, and the like.

In some embodiments, the matrix material includes scattering microbeads such as $TiO_2$ microbeads, ZnS microbeads, or glass microbeads that can improve photo conversion efficiency of the nanostructure film. In some embodiments, the matrix material can include light blocking elements.

In some embodiments, the matrix material can have low oxygen and moisture permeability, exhibit high photo- and chemical-stability, exhibit favorable refractive indices, and adhere to outer surfaces of the nanostructures, thus providing an air-tight seal to protect the nanostructures. In another embodiment, the matrix material can be curable with UV or thermal curing methods to facilitate roll-to-roll processing.

In some embodiments, a nanostructure film can be formed by mixing nanostructures in a polymer (e.g., photoresist) and casting the nanostructure-polymer mixture on a substrate, mixing the nanostructures with monomers and polymerizing them together, mixing nanostructures in a sol-gel to form an oxide, or any other method known to those skilled in the art.

In some embodiments, the formation of a nanostructure film can include a film extrusion process. The film extrusion process can include forming a homogenous mixture of matrix material and barrier layer coated core-shell nanostructures such as nanostructures functionalized with a metal halide and/or a metal carboxylate, introducing the homogenous mixture into a top mounted hopper that feeds into an extruder. In some embodiments, the homogenous mixture can be in the form of pellets. The film extrusion process can further include extruding a nanostructure film from a slot die and passing an extruded nanostructure film through chill rolls. In some embodiments, the extruded nanostructure film can have a thickness less than about 75 μm, for example, in a range from about 70 μm to about 40 μm, about 65 μm to about 40 μm, about 60 μm to about 40 μm, or about 50 μm to about 40 μm. In some embodiments, the nanostructure film has a thickness less than about 10 μm. In some embodiments, the formation of the nanostructure film can optionally include a secondary process followed by the film extrusion process. The secondary process can include a process such as co-extrusion, thermoforming, vacuum forming, plasma treatment, molding, and/or embossing to provide a texture to a top surface of the nanostructure film layer. The textured top surface nanostructure film can help to improve, for example defined optical diffusion property and/or defined angular optical emission property of the nanostructure film.

Nanostructure Molded Article

In some embodiments, the nanostructure composition is used to form a nanostructure molded article. In some embodiments, the nanostructure molded article is a liquid crystal display (LCD) or a light emitting diode (LED). In some embodiments, the nanostructure composition is used to form the emitting layer of an illumination device. The illumination device can be used in a wide variety of applications, such as flexible electronics, touchscreens, monitors, televisions, cellphones, and any other high definition displays. In some embodiments, the illumination device is a light emitting diode or a liquid crystal display. In some embodiments, the illumination device is a quantum dot light emitting diode (QLED). An example of a QLED is disclosed in U.S. patent application Ser. No. 15/824,701, which is incorporated herein by reference in its entirety.

In some embodiments, the present disclosure provides a light emitting diode comprising:

(a) a first conductive layer;
(b) a second conductive layer; and
(c) an emitting layer between the first conductive layer and the second conductive layer, wherein the emitting layer comprises (i) at least one population of nanostructures, the nanostructures comprising a core comprising indium phosphide and at least two shells, wherein at least one of the shells comprises zinc, wherein the nanostructure displays a photoluminescence quantum yield between about 90% and about 100%, and a wherein the nanostructure has a full width at half-maximum of less than 45 nm.

In some embodiments, the emitting layer is a nanostructure film.

In some embodiments, the light emitting diode comprises a first conductive layer, a second conductive layer, and an emitting layer, wherein the emitting layer is arranged between the first conductive layer and the second conductive layer. In some embodiments, the emitting layer is a thin film.

In some embodiments, the light emitting diode comprises additional layers between the first conductive layer and the second conductive layer such as a hole injection layer, a hole transport layer, and an electron transport layer. In some embodiments, the hole injection layer, the hole transport layer, and the electron transport layer are thin films. In some embodiments, the layers are stacked on a substrate.

When voltage is applied to the first conductive layer and the second conductive layer, holes injected at the first conductive layer move to the emitting layer via the hole injection layer and/or the hole transport layer, and electrons injected from the second conductive layer move to the emitting layer via the electron transport layer. The holes and electrons recombine in the emitting layer to generate excitons.

Quantum Dot on Glass LCD Display Device

In some embodiments, the nanostructure film is incorporated into a quantum dot on glass LCD display device. A LCD display device can include a nanostructure film formed directly on a light guide plate (LGP) without necessitating an intermediate substrate or barrier layer. In some embodiments, a nanostructure film can be a thin film. In some embodiments, a nanostructure film can have a thickness of 500 μm or less, 100 μm or less, or 50 μm or less. In some embodiments, a nanostructure film is a thin film having a thickness of about 15 μm or less.

A LGP can include an optical cavity having one or more sides, including at least a top side, comprising glass. Glass provides excellent resistance to impurities including moisture and air. Moreover, glass can be formed as a thin substrate while maintaining structural rigidity. Therefore, a LGP can be formed at least partially of a glass surface to provide a substrate having sufficient barrier and structural properties.

In some embodiments, a nanostructure film can be formed on a LGP. In some embodiments, the nanostructure film comprises a population of nanostructures embedded in a matrix material, such as a resin. A nanostructure film can be formed on a LGP by any method known in the art, such as wet coating, painting, spin coating, or screen printing. After deposition, a resin of a nanostructure film can be cured. In some embodiments a resin of one or more nanostructure films can be partially cured, further processed and then finally cured. The nanostructure films can be deposited as one layer or as separate layers, and the separate layers can comprise varying properties. The width and height of the nanostructure films can be any desired dimensions, depending on the size of the viewing panel of the display device.

For example, the nanostructure films can have a relatively small surface area in small display device embodiments such as watches and phones, or the nanostructure films can have a large surface area for large display device embodiments such as TVs and computer monitors.

In some embodiments, an optically transparent substrate is formed on a nanostructure film by any method known in the art, such as vacuum deposition, vapor deposition, or the like. An optically transparent substrate can be configured to provide environmental sealing to the underlying layers and/or structures of the nanostructure film. In some embodiments, light blocking elements can be included in the optically transparent substrate. In some embodiments, light blocking elements can be included in a second polarizing filter, which can be positioned between the substrate and the nanostructure film. In some embodiments, light blocking elements can be dichroic filters that, for example, can reflect the primary light (e.g., blue light, UV light, or combination of UV light and blue light) while transmitting the secondary light. Light blocking elements can include specific UV light filtering components to remove any unconverted UV light from the red and green sub-pixels, and/or the UV light from the blue sub-pixels.

On-Chip and Near Chip Placement of Quantum Dots

In some embodiments, the nanostructures are incorporated into display devices by "on-chip" placements. As used herein, "on-chip" refers to placing nanostructures into an LED cup. In some embodiments, the nanostructures are dissolved in a resin or a fluid to fill the LED cup.

In some embodiments, the nanostructures are incorporated into display devices by "near-chip" placements. As used herein, "near-chip" refers to coating the top surface of the LED assembly with nanostructures such that the outgoing light passes through the nanostructure film.

Display Device with Nanostructure Color Conversion Layer

In some embodiments, the present invention provides a display device comprising:
  (a) a display panel to emit a first light;
  (b) a backlight unit configured to provide the first light to the display panel; and
  (c) a color filter comprising at least one pixel region comprising a color conversion layer.

In some embodiments, the color filter comprises at least 1, 2, 3, 4, 5, 6, 7, 8, 9, or 10 pixel regions. In some embodiments, when blue light is incident on the color filter, red light, white light, green light, and/or blue light may be respectively emitted through the pixel regions. In some embodiments, the color filter is described in U.S. Patent Appl. Publication No. 2017/153366, which is incorporated herein by reference in its entirety.

In some embodiments, each pixel region includes a color conversion layer. In some embodiments, a color conversion layer comprises nanostructures described herein configured to convert incident light into light of a first color. In some embodiments, the color conversion layer comprises nanostructures described herein configured to convert incident light into blue light.

In some embodiments, the display device comprises 1, 2, 3, 4, 5, 6, 7, 8, 9, or 10 color conversion layers. In some embodiments, the display device comprises 1 color conversion layer comprising the nanostructures described herein. In some embodiments, the display device comprises 2 color conversion layers comprising the nanostructures described herein. In some embodiments, the display device comprises 3 color conversion layers comprising the nanostructures described herein. In some embodiments, the display device comprises 4 color conversion layers comprising the nanostructures described herein. In some embodiments, the display device comprises at least one red color conversion layer, at least one green color conversion layer, and at least one blue color conversion layer.

In some embodiments, the color conversion layer has a thickness between about 3 μm and about 10 μm, about 3 μm and about 8 μm, about 3 μm and about 6 μm, about 6 μm and about 10 μm, about 6 μm and about 8 μm, or about 8 μm and about 10 μm. In some embodiments, the color conversion layer has a thickness between about 3 μm and about 10 μm.

The nanostructure color conversion layer can be deposited by any suitable method known in the art, including but not limited to painting, spray coating, solvent spraying, wet coating, adhesive coating, spin coating, tape-coating, roll coating, flow coating, inkjet printing, photoresist patterning, drop casting, blade coating, mist deposition, or a combination thereof. In some embodiments, the nanostructure color conversion layer is deposited by photoresist patterning. In some embodiments, nanostructure color conversion layer is deposited by inkjet printing.

Inkjet Printing

The formation of thin films using dispersions of nanostructures in organic solvents is often achieved by coating techniques such as spin coating. However, these coating techniques are generally not suitable for the formation of thin films over a large area and do not provide a means to pattern the deposited layer and thus, are of limited use. Inkjet printing allows for precisely patterned placement of thin films on a large scale at low cost. Inkjet printing also allows for precise patterning of nanostructure layers, allows printing pixels of a display, and eliminates photopatterning. Thus, inkjet printing is very attractive for industrial application—particularly in display applications.

Solvents commonly used for inkjet printing are dipropylene glycol monomethyl ether acetate (DPMA), polyglycidyl methacrylate (PGMA), diethylene glycol monoethyl ether acetate (EDGAC), and propylene glycol methyl ether acetate (PGMEA). Volatile solvents are also frequently used in inkjet printing because they allow rapid drying. Volatile solvents include ethanol, methanol, 1-propanol, 2-propanol, acetone, methyl ethyl ketone, methyl isobutyl ketone, ethyl acetate, and tetrahydrofuran. Conventional nanostructures generally cannot be dissolved in these solvents. However, the increased hydrophilicity of the nanostructures comprising poly(alkylene oxide) ligands allows for increased solubility in these solvents.

In some embodiments, the nanostructures described herein used for inkjet printing are dispersed in a solvent selected from DPMA, PGMA, EDGAC, PGMEA, ethanol, methanol, 1-propanol, 2-propanol, acetone, methyl ethyl ketone, methyl isobutyl ketone, ethyl acetate, tetrahydrofuran, chloroform, chlorobenzene, cyclohexane, hexane, heptane, octane, hexadecane, undecane, decane, dodecane, xylene, toluene, benzene, octadecane, tetradecane, butyl ether, or combinations thereof. In some embodiments, the nanostructures comprising a poly(alkylene oxide) ligands described herein used for inkjet printing are dispersed in a solvent selected from DPMA, PGMA, EDGAC, PGMEA, ethanol, methanol, 1-propanol, 2-propanol, acetone, methyl ethyl ketone, methyl isobutyl ketone, ethyl acetate, tetrahydrofuran, or combinations thereof.

In order to be applied by inkjet printing or microdispensing, the inkjet compositions comprising nanostructures should be dissolved in a suitable solvent. The solvent must be able to disperse the nanostructure composition and must not have any detrimental effect on the chosen print head.

In some embodiments, the inkjet composition further comprises one or more additional components such as surface-active compounds, lubricating agents, wetting agents, dispersing agents, hydrophobing agents, adhesive agents, flow improvers, defoaming agents, deaerators, diluents, auxiliaries, colorants, dyes, pigments, sensitizers, stabilizers, and inhibitors.

In some embodiments, the nanostructure compositions described herein comprise by weight of the inkjet composition between about 0.01% and about 20%. In some embodiments, the nanostructures comprising poly(alkylene oxide) ligands comprise by weight of the inkjet composition between about 0.01% and about 20%, about 0.01% and about 15%, about 0.01% and about 10%, about 0.01% and about 5%, about 0.01% and about 2%, about 0.01% and about 1%, about 0.01% and about 0.1%, about 0.01% and about 0.05%, about 0.05% and about 20%, about 0.05% and about 15%, about 0.05% and about 10%, about 0.05% and about 5%, about 0.05% and about 2%, about 0.05% and about 1%, about 0.05% and about 0.1%, about 0.1% and about 20%, about 0.1% and about 15%, about 0.1% and about 10%, about 0.1% and about 5%, about 0.1% and about 2%, about 0.1% and about 1%, about 0.5% and about 20%, about 0.5% and about 15%, about 0.5% and about 10%, about 0.5% and about 5%, about 0.5% and about 2%, about 0.5% and about 1%, about 1% and about 20%, about 1% and about 15%, about 1% and about 10%, about 1% and about 5%, about 1% and about 2%, about 2% and about 20%, about 2% and about 15%, about 2% and about 10%, about 2% and about 5%, about 5% and about 20%, about 5% and about 15%, about 5% and about 10%, about 10% and about 20%, about 10% and about 15%, or about 15% and 20%.

In some embodiments, the inkjet composition comprising a nanostructure or a nanostructure composition described herein is used in the formulation of an electronic device. In some embodiments, the inkjet composition comprising a nanostructure or a nanostructure composition described herein is used in the formulation of an electronic device selected from the group consisting of a nanostructure film, a display device, a lighting device, a backlight unit, a color filter, a surface light-emitting device, an electrode, a magnetic memory device, and a battery. In some embodiments, the inkjet composition comprising a nanostructure composition described herein is used in the formulation of a light-emitting device.

EXAMPLES

The following examples are illustrative and non-limiting, of the products and methods described herein. Suitable modifications and adaptations of the variety of conditions, formulations, and other parameters normally encountered in the field and which are obvious to those skilled in the art in view of this disclosure are within the spirit and scope of the invention.

Example 1

Method to Prepare In Situ Zinc Dioleate ($Zn(OA)_2$)

$Zn(OAc)_2$, the corresponding oleic acid, and the reagents used in the shelling process (1-octadecene and lauric acid) were loaded into the reactor. The mixture was heated to 100° C. When the reaction mixture reached 100° C., zinc dioleate ($Zn(OA)_2$) started to form. By continuously removing acetic acid using vacuum, this process was facilitated. On a small scale, zinc acetate was totally dissolved within 10 minutes. The dissolution took about 60 minutes on a 5 liter scale and about 100 minutes on a 200 gallon scale.

After the formation of in situ zinc dioleate, the solution was transparent. Conversely, zinc dioleate prepared prior to the shelling process (and stored) was a dark brown-yellow color after dissolution. This indicates the high quality of the in situ zinc dioleate.

After the formation of in situ zinc dioleate, InP/ZnSe/ZnS nanostructures were prepared using the method described in U.S. Patent Appl. Publication No. 2017/306227. Comparison of the peak absorption wavelength, peak emission wavelength, full width at half-maximum (FWHM), and quantum yield (QY) of InP/ZnSe/ZnS nanostructures prepared using different dissolution conditions are shown in TABLE 1.

TABLE 1

InP/ZnSe/ZnS nanostructure properties based on dissolution conditions

| Sample | Absorbance maximum (nm) | Emission maximum (nm) | FWHM (nm) | QY (%) | $Zn(OA)_2$ Method |
|---|---|---|---|---|---|
| 1 | 499.2 | 525.8 | 38.6 | 95.6 | Pre-made $Zn(OA)_2$ |
| 2 | 495.9 | 523.2 | 38.2 | 93.4 | in situ $Zn(OA)_2$ |
| 3 | 499.4 | 525.9 | 38.4 | 94.9 | in situ $Zn(OA)_2$ |

As shown in TABLE 1, addition of ZnSe and ZnS shell layers using in situ produced $Zn(OA)_2$ provided InP/ZnSe/ZnS quantum dots in quantum yields around 95%. And, this process was easily scaled up for use in a 200 gallon reactor which produced InP/ZnSe/ZnS nanostructures with a quantum yield of 94.1%.

Example 2

Typical Procedure for Synthesis of InP/ZnSe/ZnS Quantum Dots Using Metal Halides In a typical procedure, zinc dioleate, lauric acid, and 1-octadecene were added to a reaction flask and the temperature was ramped to 110° C. A core solution was added to the reaction mixture and the cores were etched until they reach the desired size. Trioctylphosphine selenide was added to the reaction mixture and the temperature was increased to 270° C. Then decanethiol was added to the reaction mixture at 270° C. The temperature of the reaction mixture was increased to 310° C. and held. The resulting quantum dots were purified to remove reaction by-products and excess reagent.

It was found that quantum yield in excess of 97% could be obtained by introducing metal halides during different stages of the shelling process. For example, a 3% increase in quantum yield was obtained by introducing $ZnCl_2$ before core etching. And, an additional 2% increase in quantum yield was obtained by further introducing $GaCl_3/ZnBr_2$ after core etching. Finally, an additional 3% increase in quantum yield was obtained by further treating the purified quantum dots with $ZnCl_2$.

Details of the peak wavelength (PWL), full width at half-maximum (FWHM), and quantum yield (QY) of InP/ZnSe/ZnS quantum dots synthesized are shown in TABLE 2. Examples 4-8 in TABLE 2 are results for quantum dots emitting with a green wavelength and Examples 9 and 10 are results for quantum dots emitting with a red wavelength.

TABLE 2

InP/ZnSe/ZnS quantum dots synthesized using metal halides

| Sample | Metal Halide | PWL (nm) | FWHM (nm) | QY (%) |
|---|---|---|---|---|
| 4 | No metal halide in the shelling process | 528.6 | 38.9 | 87.1 |
| 5 | $ZnCl_2$ before core etching | 530.0 | 39.0 | 90.8 |
| 6 | $ZnCl_2$ before core etching | 525.6 | 37.6 | 91.1 |
| 7 | $ZnCl_2$ before core etching, $GaCl_3/ZnBr_2$ after core etching | 526.0 | 37.6 | 94.7 |
| 8 | $ZnCl_2$ before core etching, $GaCl_3/ZnBr_2$ after core etching, $ZnCl_2$ after shelling | 526.2 | 37.8 | 97.4 |
| 9 | $ZnCl_2$ before core etching | 628.0 | 40.8 | 91.7 |
| 10 | $ZnCl_2$ before core etching, $GaCl_3/ZnBr_2$ after core etching | 628.9 | 40.7 | 94.0 |

Other combinations of metal halides were added at various stages of the shelling process. As shown in TABLE 3, higher quantum yield was obtained by replacing $GaCl_3/ZnBr_2$ after core etching with $ZrCl_4$, $AlCl_3/ZnBr_2$, $ZrCl_4/YCl_3/MgBr_2$, or $ZrCl_4/YCl_3$.

TABLE 3

InP/ZnSe/ZnS quantum dots using various metal halides after acid etch step

| Sample | Metal Halide | PWL (nm) | FWHM (nm) | QY (%) |
|---|---|---|---|---|
| 11 | $ZnCl_2$ before core etching, $GaCl_3/ZnBr_2$ after core etching | 526.0 | 37.6 | 94.7 |
| 12 | $ZnCl_2$ before core etching, $ZrCl_4$ after core etching | 525.8 | 37.5 | 96.3 |
| 13 | $ZnCl_2$ before core etching, $AlCl_3/ZnBr_2$ after core etching | 526.6 | 37.8 | 96.5 |
| 14 | $ZnCl_2$ before core etching, $ZrCl_4/YCl_3/MgBr_2$ after core etching | 525.5 | 37.4 | 97.0 |
| 15 | $ZnCl_2$ before core etching, $ZrCl_4/YCl_3$ after core etching | 525.5 | 37.6 | 96.1 |

Example 3

Preparation of Sample 7 InP/ZnSe/ZnS Quantum Dots

To a 100 mL reaction flask under inert atmosphere was added 10.4 g zinc dioleate, 0.56 g oleic acid, 50 mg zinc chloride, and 10 mL 1-octadecene. The mixture was heated to 150° C. under vacuum while stirring and held for 15 minutes. After 15 minutes hold time, the flask was refilled with nitrogen and 0.1 g InP core was injected into the reaction mixture. After 15 minutes, 50 mg of gallium chloride and 50 mg of zinc bromide were added. The solution was heated to 300° C. 4.8 mL of 2 M trioctylphosphine selenide was infused into the flask over 5 minutes followed by 2.5 mL of dodecanethiol infused into the flask over 5 minutes. The solution was held for 60 minutes. The solution was then cooled to room temperature before further purification.

Example 4

Preparation of Sample 8 InP/ZnSe/ZnS Quantum Dots

To a 100 mL reaction flask under inert atmosphere was added 10.4 g zinc dioleate, 0.56 g oleic acid, 50 mg zinc chloride, and 10 mL 1-octadecene. The mixture was heated to 150° C. under vacuum while stirring and held for 15 minutes. After 15 minutes hold time, the flask was refilled with nitrogen and 0.1 g InP core was injected into the reaction mixture. After 15 minutes, 50 mg of gallium chloride and 50 mg of zinc bromide were added. The solution was heated to 300° C. 4.8 mL of 2 M trioctylphosphine selenide was infused into the flask over 5 minutes followed by 2.5 mL of dodecanethiol infused into the flask over 5 minutes. The solution was held for 60 minutes.

The quantum dots were washed with 1 volume of toluene and 2 volumes of ethanol. The cloudy solution was centrifuged at 4000 rpm for 5 minutes. The supernatant was discarded and 5 mL of toluene was added to dissolve the resultant pellet. 0.1 g of zinc chloride was added to the solution.

Example 5

Preparation of Sample 13 InP/ZnSe/ZnS Quantum Dots

To a 100 mL reaction flask under inert atmosphere was added 10.4 g zinc dioleate, 0.56 g oleic acid, 50 mg zinc chloride, and 10 mL 1-octadecene. The mixture was heated to 150° C. under vacuum while stirring and held for 15 minutes. After 15 minutes hold time, the flask was refilled with nitrogen and 0.1 g InP core was injected into the reaction mixture. After 15 minutes, 0.25 g aluminum chloride and 0.1 g zinc bromide were added. The solution was heated to 300° C. 4.8 mL of 2 M trioctylphosphine selenide was infused into the flask over 5 minutes followed by 2.5 mL of dodecanethiol infused into the flask over 5 minutes. The solution was held for 60 minutes. Then, the solution was cooled to room temperature before further purification.

Example 6

Preparation of Sample 14 InP/ZnSe/ZnS Quantum Dots

To a 100 mL reaction flask under inert atmosphere was added 10.4 g zinc dioleate, 0.56 g oleic acid, 50 mg zinc chloride, and 10 mL 1-octadecene. The mixture was heated to 150° C. under vacuum while stirring and held for 15 minutes. After 15 minutes hold time, the flask was refilled with nitrogen and 0.1 g InP core was injected into the reaction mixture. After 15 minutes, 50 mg zirconium chloride, 50 mg yttrium chloride, and 50 mg magnesium bromide were added. The solution was heated to 300° C. 4.8 mL of 2 M trioctylphosphine selenide was infused into the flask over 5 minutes followed by 2.5 mL of dodecanethiol infused into the flask over 5 minutes. The solution was held for 60 minutes. Then, the solution was cooled to room temperature before further purification.

Having now fully described this invention, it will be understood by those of ordinary skill in the art that the same can be performed within a wide and equivalent range of conditions, formulations and other parameters without affecting the scope of the invention or any embodiment thereof. All patents, patent applications, and publications cited herein are fully incorporated by reference herein in their entirety.

What is claimed is:

1. A nanostructure comprising a core comprising indium phosphide and a first shell and a second shell, wherein the first shell comprises ZnSe and the second shell comprises ZnS, wherein the nanostructure displays a photoluminescence quantum yield between 94% and 100%, and wherein the nanostructure has a full width at half-maximum of less than 45 nm.

2. The nanostructure of claim 1, wherein the nanostructure exhibits a photoluminescence quantum yield of between 96% and 100%.

3. The nanostructure of claim 1, wherein the nanostructure exhibits a full width at half-maximum of between 10 nm and 40 nm.

4. A nanostructure composition comprising:
(a) a nanostructure comprising a core comprising indium phosphide and a first shell and a second shell, wherein the first shell comprises ZnSe and the second shell comprises ZnS, wherein the nanostructure displays a photoluminescence quantum yield between 94% and 100%, and wherein the nanostructure has a full width at half-maximum of less than 45 nm; and
(b) at least one organic resin.

5. A method of preparing a nanostructure comprising a core and a first shell and a second shell, comprising:
(a) admixing a zinc source and a core comprising InP;
(b) admixing (a) with an organic acid;
(c) admixing (b) with at least one shell precursor;
(d) raising, lowering, or maintaining the temperature to between about 200° C. and about 310° C.;
(e) admixing (d) with at least one shell precursor, wherein the shell precursor is different from the shell precursor in (c); and
(f) raising, lowering, or maintaining the temperature to between about 200° C. and about 310° C., and further comprising admixing (f) with at least one metal halide, wherein the at least one metal halide admixed is $ZnCl_2$;
to produce a nanostructure comprising a core and a first shell and a second shell, wherein the first shell comprises ZnSe and the second shell comprises ZnS, and wherein the nanostructure displays a photoluminescence quantum yield between 94% and 100%.

6. The method of claim 5, wherein the admixing in (a) or (c) further comprises at least one metal halide.

7. The method of claim 5, wherein the organic acid is oleic acid.

8. The method of claim 6, wherein the at least one metal halide admixed in (a) is $ZnCl_2$.

9. The method of claim 6, wherein the at least one metal halide admixed in (c) is $GaCl_3$, $AlCl_3$, $YCl_3$, $MgBr_2$, $ZnBr_2$, $ZrCl_4$, and combinations thereof.

10. The method of claim 5, wherein the at least one shell precursor in (c) is a selenium source or a sulfur source.

11. The method of claim 5, wherein the nanostructure has a full width at half-maximum of between 10 nm and 40 nm.

12. A nanostructure molded article comprising:
(a) a first conductive layer;
(b) a second conductive layer; and
(c) a nanostructure layer between the first conductive layer and the second conductive layer, wherein the nanostructure layer comprises a population of nanostructures comprising a core comprising indium phosphide and a first shell and a second shell, wherein the first shell comprises ZnSe and the second shell comprises ZnS, wherein the nanostructure displays a photoluminescence quantum yield between 94% and 100%, and wherein the nanostructure has a full width at half-maximum of less than 45 nm; and at least one organic resin.

13. The nanostructure molded article of claim 12, wherein the nanostructure exhibits a full width at half-maximum of between 10 nm and 10 nm.

* * * * *

UNITED STATES PATENT AND TRADEMARK OFFICE
CERTIFICATE OF CORRECTION

| | |
|---|---|
| PATENT NO. | : 12,049,582 B2 |
| APPLICATION NO. | : 16/847782 |
| DATED | : July 30, 2024 |
| INVENTOR(S) | : Yeewah Annie Chow et al. |

It is certified that error appears in the above-identified patent and that said Letters Patent is hereby corrected as shown below:

In the Claims

In Claim 13, Line 30, delete "between 10 nm and 10nm." and insert --between 10nm and 40nm.--

Signed and Sealed this
Fifth Day of November, 2024

Katherine Kelly Vidal
*Director of the United States Patent and Trademark Office*